United States Patent
Satou et al.

(10) Patent No.: US 11,901,249 B2
(45) Date of Patent: Feb. 13, 2024

(54) CURABLE COMPOSITION AND CURED PRODUCT THEREOF

(71) Applicant: DIC Corporation, Tokyo (JP)

(72) Inventors: Yutaka Satou, Ichihara (JP); Kazuhisa Yamoto, Ichihara (JP); Koji Hayashi, Ichihara (JP)

(73) Assignee: DIC Corporation, Tokyo (JP)

( * ) Notice: Subject to any disclaimer, the term of this patent is extended or adjusted under 35 U.S.C. 154(b) by 766 days.

(21) Appl. No.: 17/041,674

(22) PCT Filed: Mar. 14, 2019

(86) PCT No.: PCT/JP2019/010502
§ 371 (c)(1),
(2) Date: Sep. 25, 2020

(87) PCT Pub. No.: WO2019/188330
PCT Pub. Date: Oct. 3, 2019

(65) Prior Publication Data
US 2021/0009804 A1    Jan. 14, 2021

(30) Foreign Application Priority Data

Mar. 29, 2018  (JP) .................................. 2018-064714

(51) Int. Cl.
| | | |
|---|---|---|
| *C08G 63/547* | (2006.01) | |
| *H01L 23/29* | (2006.01) | |
| *C08L 67/02* | (2006.01) | |
| *H05K 1/03* | (2006.01) | |
| *C08K 5/3415* | (2006.01) | |

(52) U.S. Cl.
CPC .......... *H01L 23/293* (2013.01); *C08G 63/547* (2013.01); *C08L 67/02* (2013.01); *H01L 23/29* (2013.01); *H05K 1/0326* (2013.01); *C08K 5/3415* (2013.01)

(58) Field of Classification Search
CPC ................................................. C08G 63/547
See application file for complete search history.

(56) References Cited

U.S. PATENT DOCUMENTS

| | | | | |
|---|---|---|---|---|
| 5,359,020 A | * | 10/1994 | Brunner | C08G 73/12 |
| | | | | 526/333 |
| 2016/0272757 A1 | | 9/2016 | Isahaya et al. | |
| 2017/0129837 A1 | * | 5/2017 | Onda | C08G 63/547 |

FOREIGN PATENT DOCUMENTS

| | | | |
|---|---|---|---|
| CN | 106977717 | * | 7/2017 |
| EP | 0489691 | * | 6/1992 |
| EP | 0890615 | * | 1/1999 |
| JP | 2012-246367 | * | 12/2012 |
| JP | 2016-156019 A | | 9/2016 |
| KR | 10-2017-0055430 A | | 5/2017 |
| WO | 2015/072473 A1 | | 5/2015 |

OTHER PUBLICATIONS

Translation of CN 106977717 (Year: 2017).*
Translation of JP 2012-246367 (Year: 2012).*
1 International Search Report dated May 28, 2019, issued for PCT/JP2019/010502.

* cited by examiner

*Primary Examiner* — Robert C Boyle
(74) *Attorney, Agent, or Firm* — Locke Lord LLP

(57) ABSTRACT

A curable composition to be cured to provide a cured product excellent in heat resistance and dielectric properties, a cured product of the curable composition, a printed wiring board, a semiconductor sealing material, and a build-up film using the curable composition. There is provided a curable composition containing an aromatic ester resin (A) and a maleimide compound (B), the aromatic ester resin (A) being an active ester resin that is a reaction product of a first aromatic compound having two or more phenolic hydroxy groups, a second aromatic compound having a phenolic hydroxy group, and a third aromatic compound having two or more carboxy groups and/or an acid halide thereof or an esterified compound thereof, in which at least one of the first aromatic compound, the second aromatic compound, and the third aromatic compound and/or the acid halide thereof or the esterified compound thereof has a polymerizable unsaturated bond-containing substituent.

18 Claims, No Drawings

CURABLE COMPOSITION AND CURED PRODUCT THEREOF

TECHNICAL FIELD

The present invention relates to a curable composition to be cured to provide a cured product excellent in heat resistance and dielectric properties, a cured product of the curable composition, a printed wiring board, a semiconductor sealing material, and a build-up film obtained using the curable composition.

BACKGROUND ART

In recent years, electronic devices have been reduced in size and increased in performance, and accordingly, various materials used have been required to have higher performance. For example, in semiconductor package substrates, higher speeds and higher frequencies of signals are used, and materials having low electrical energy losses, i.e., low dielectric loss tangents, are required.

As such a material having a low dielectric loss tangent, for example, an invention relating to a resin composition containing (A) an epoxy resin, (B) an active ester compound, (C) a smear-suppressing component, and (D) an inorganic filler is provided (for example, see Patent Literature 1). In this case, the resin composition is characterized in that predetermined amounts of the active ester compound (B), the smear-suppressing component (C), and the inorganic filler (D) are contained based on 100% by mass of a non-volatile component in the resin composition and that the smear-suppressing component (C) is formed of rubber particles.

Patent Literature 1 states that a cured product obtained from the resin composition can achieve a low dielectric loss tangent. It is also stated that a smear (resin residue) in a via hole after the cured product is subjected to drilling processing and then roughing treatment can be reduced.

It is also stated that the active ester compound (B) described in Patent Literature 1 is a compound that has one or more active ester groups in one molecule and that reduces the dielectric loss tangent of the cured product of the resin composition.

CITATION LIST

Patent Literature

PTL 1: Japanese Unexamined Patent Application Publication No. 2016-156019

SUMMARY OF INVENTION

Technical Problem

Patent Literature 1 states that the use of the active ester compound enables a reduction in the dielectric loss tangent of a cured product to be obtained. However, it has been found that such a cured product may not always have sufficient heat resistance.

Solution to Problem

The inventors have conducted intensive studies to solve the foregoing problems and have found that a curable composition containing an aromatic ester resin having a specific structure containing a polymerizable unsaturated bond in its molecular structure and a maleimide compound provides a cured product significantly excellent in heat resistance and dielectric properties. This finding has led to the completion of the present invention.

That is, the present invention provides a curable composition containing an aromatic ester resin (A) containing a polymerizable unsaturated bond and a maleimide compound (B), a cured product thereof, a printed wiring board, a semiconductor sealing material, and a build-up film obtained using the curable composition.

Advantageous Effects of Invention

According to the present invention, a curable composition to be cured to provide a cured product excellent in heat resistance and dielectric properties, a cured product obtained from the curable composition, a printed wiring board, a semiconductor sealing material, and a build-up film obtained using the curable composition.

DESCRIPTION OF EMBODIMENTS

Embodiments for carrying out the present invention will be described in detail below.

An aromatic ester resin (A) used in the present invention is an aromatic ester resin having one or more polymerizable unsaturated bonds in its molecular structure and a structural moiety in which aromatic rings are bonded via an ester linkage.

The aromatic ester resin (A) is a reaction product of a first aromatic compound having two or more phenolic hydroxy groups, a second aromatic compound having a phenolic hydroxy group, and a third aromatic group having two or more carboxy groups and/or an acid halide thereof or an esterified compound thereof, in which at least one of the first aromatic compound, the second aromatic compound, and the third aromatic compound and/or the acid halide thereof or esterified compound has a polymerizable unsaturated bond-containing substituent.

Preferably, the aromatic ester compound (A) is liquid at ordinary temperature (25° C.) or has a softening point in the range of 40° C. to 200° C., from the viewpoint of achieving better handleability when adjusted as a curable composition described below, and a better balance between the heat resistance and the dielectric properties of a cured product thereof.

[First Aromatic Compound]

The first aromatic compound has two or more phenolic hydroxy groups. Because two or more phenolic hydroxy groups are contained, the first aromatic compound can react with the third aromatic compound and so forth described below to form a polyester structure in the aromatic ester resin (A).

Examples of the first aromatic compound include, but are not particularly limited to, compounds each containing two or more phenolic hydroxy groups on a substituted or unsubstituted first aromatic ring having 3 to 30 carbon atoms.

In this case, examples of the first aromatic ring having 3 to 30 carbon atoms include, but are not particularly limited to, monocyclic aromatic rings, fused aromatic rings, and aromatic ring assemblies.

Examples of the monocyclic aromatic rings include, but are not particularly limited to, benzene, furan, pyrrole, thiophene, imidazole, pyrazole, oxazole, isoxazole, thiazole, isothiazole, pyridine, pyrimidine, pyridazine, pyrazine, and triazine.

Examples of the fused aromatic rings include, but are not particularly limited to, naphthalene, anthracene, phenalene, phenanthrene, quinoline, isoquinoline, quinazoline, phthalazine, pteridine, coumarin, indole, benzimidazole, benzofuran, and acridine.

Examples of the aromatic ring assemblies include, but are not particularly limited to, biphenyl, binaphthalene, bipyridine, bithiophene, phenylpyridine, phenylthiophene, terphenyl, diphenylthiophene, and quaterphenyl.

The first aromatic ring may have a substituent. In this case, examples of the "substituent on the first aromatic ring" include, but are not particularly limited to, alkyl groups each having 1 to 10 carbon atoms, alkoxy groups each having 1 to 10 carbon atoms, a halogen atom, and polymerizable unsaturated bond-containing substituents.

Examples of the alkyl groups each having 1 to 10 carbon atoms include, but are not particularly limited to, a methyl group, an ethyl group, a propyl group, an isopropyl group, a n-butyl group, an isobutyl group, a sec-butyl group, a tert-butyl group, a n-pentyl group, an isopentyl group, a tert-pentyl group, a neopentyl group, a 1,2-dimethylpropyl group, a n-hexyl group, an isohexyl group, a n-nonyl group, a cyclopropyl group, a cyclobutyl group, a cyclopentyl group, a cyclohexyl group, a cycloheptyl group, a cyclooctyl group, and a cyclononyl group.

Examples of the alkoxy groups each having 1 to 10 carbon atoms include, but are not particularly limited to, a methoxy group, an ethoxy group, a propoxy group, an isopropoxy group, a butoxy group, a pentyloxy group, a hexyloxy group, a 2-ethylhexyloxy group, an octyloxy group, and a nonyloxy group.

Examples of the halogen atom include a fluorine atom, a chlorine atom, a bromine atom, and an iodine atom.

The polymerizable unsaturated bond-containing substituent refers to a substituent having at least one polymerizable unsaturated bond and preferably having 2 to 30 carbon atoms. In this case, the "unsaturated bond" refers to a double bond between carbon atoms or a triple bond between carbon atoms. Examples of the polymerizable unsaturated bond-containing substituent include alkenyl groups and alkynyl groups.

Examples of the alkenyl groups include, but are not particularly limited to, a vinyl group, an allyl group, a propenyl group, an isopropenyl group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, a 2-octenyl group, a 1-undecenyl group, a 1-pentaundecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, and a pentadeca-1,4,7-trienyl group.

Examples of the alkynyl groups include, but are not particularly limited to, an ethynyl group, a propargyl group, a 1-butynyl group, a 2-butynyl group, a 3-butynyl group, a 3-pentynyl group, a 4-pentynyl group, and a 1,3-butadiynyl group.

Among these, the polymerizable unsaturated bond-containing substituent is preferably an alkenyl group having 2 to 30 carbon atoms, more preferably an alkenyl group having 2 to 10 carbon atoms, still more preferably an alkenyl group having 2 to 5 carbon atoms, particularly preferably a vinyl group, an allyl group, a propenyl group, an isopropenyl group, a 1-propenyl group, a 1-butenyl group, a 2-butenyl group, a 3-butenyl group, or a 1,3-butadienyl group, most preferably an allyl group, a propenyl group, an isopropenyl group, or a 1-propenyl group.

These substituents on the first aromatic ring may be contained alone or in combination of two or more.

As described above, the first aromatic compound is one in which at least two hydrogen atoms of the substituted or unsubstituted first aromatic ring are replaced with hydroxy groups.

Specific examples of the compound in which the first aromatic ring is a monocyclic aromatic ring (hereinafter, also referred to simply as a "first monocyclic aromatic ring compound") include catechol, resorcinol, hydroquinone, hydroxynol, phloroglucinol, pyrogallol, 2,3-dihydroxypyridine, 2,4-dihydroxypyridine, 4,6-dihydroxypyrimidine, 3-methylcatechol, 4-methylcatechol, and 4-allylpyrocatechol.

Specific examples of the compound in which the first aromatic ring is a fused aromatic ring (hereinafter, also referred to simply as a "first fused aromatic ring compound") include 1,3-naphthalenediol, 1,5-naphthalenediol, 2,6-naphthalenediol, 2,7-naphthalenediol, 1,2,4-naphthalenetriol, 1,4,5-naphthalenetriol, 9,10-dihydroxyanthracene, 1,4,9,10-tetrahydroxyanthracene, 2,4-dihydroxyquinoline, 2,6-dihydroxyquinoline, 5,6-dihydroxyindole, and 2-methylnaphthalene-1,4-diol.

Specific examples of the compound in which the first aromatic ring is an aromatic ring assembly (hereinafter, also referred to simply as a "first aromatic ring assembly compound") include 2,2'-dihydroxybiphenyl, 4,4'-dihydroxybiphenyl, 3,4,4'-trihydroxybiphenyl, and 2,2',3-trihydroxybiphenyl.

The first aromatic compound may have a structure in which the first aromatic rings are linked by a linking group. The first aromatic compound according to an embodiment is represented by chemical formula (1) below.

[Chem. 1]

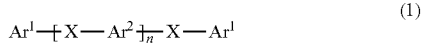

(1)

In chemical formula (1), each $Ar^1$ is independently a substituted or unsubstituted first aromatic ring group having 3 to 30 carbon atoms, each $Ar^2$ is independently a substituted or unsubstituted second aromatic ring group having 3 to 30 carbon atoms, each X is independently an oxygen atom, a sulfur atom, a substituted or unsubstituted alkylene having 1 to 20 carbon atoms, a substituted or unsubstituted cycloalkylene having 3 to 20 carbon atoms, or an aralkylene having 8 to 20 carbon atoms, and n is 0 to 10. Here, at least two hydrogen atoms of $Ar^1$ and $Ar^2$ are replaced with hydroxy groups. X corresponds to a linking group.

Each $Ar^1$ is the substituted or unsubstituted first aromatic ring group. As is clear from the description of chemical formula (1), one of the hydrogen atoms of the aromatic ring in the substituted or unsubstituted aromatic ring is bonded to "X".

Examples of the first aromatic ring group include, but are not particularly limited to, a group in which one hydrogen atom is removed from an aromatic compound, such as a group in which one hydrogen atom is removed from a monocyclic aromatic compound, e.g., benzene, furan, pyrrole, thiophene, imidazole, pyrazole, oxazole, isoxazole, thiazole, isothiazole, pyridine, pyrimidine, pyridazine, pyrazine, or triazine, and a group in which one hydrogen atom is removed from a fused aromatic compound, e.g., naphthalene, anthracene, phenalene, phenanthrene, quinoline, isoquinoline, quinazoline, phthalazine, pteridine, coumarin, indole, benzimidazole, benzofuran, or acridine. Additionally, the first aromatic ring group may be obtained from a combination of two or more of these aromatic compounds. An example thereof is a group in which one hydrogen atom is removed from an aromatic ring assembly compound, such as biphenyl, binaphthalene, bipyridine, bithiophene, phenylpyridine, phenylthiophene, terphenyl, diphenylthiophene, or quaterphenyl.

In this case, the first aromatic ring group may have a substituent. Examples of the "substituent on the first aromatic ring group" include the same as those of the "substituent on the first aromatic ring" described above.

Among these, $Ar^1$ is preferably a group in which one hydrogen atom is removed from benzene, naphthalene, anthracene, phenalene, phenanthrene, biphenyl, binaphthalene, quaterphenyl, allylbenzene, diallylbenzene, allylnaphthalene, diallylnaphthalene, allylbiphenyl, or diallylbiphenyl, more preferably a group in which one hydrogen atom is removed from benzene, naphthalene, biphenyl, allylbenzene, diallylnaphthalene, or diallylbiphenyl.

Each $Ar^2$ is independently a substituted or unsubstituted second aromatic ring group. As is clear from the description of chemical formula (1), two hydrogen atoms of the aromatic ring in the substituted or unsubstituted aromatic ring are bonded to "X".

Examples of the second aromatic ring group include, but are not particularly limited to, a group in which two hydrogen atoms are removed from an aromatic compound, such as a group in which two hydrogen atoms are removed from a monocyclic aromatic compound, e.g., benzene, furan, pyrrole, thiophene, imidazole, pyrazole, oxazole, isoxazole, thiazole, isothiazole, pyridine, pyrimidine, pyridazine, pyrazine, or triazine, and a group in which two hydrogen atoms are removed from a fused aromatic compound, e.g., naphthalene, anthracene, phenalene, phenanthrene, quinoline, isoquinoline, quinazoline, phthalazine, pteridine, coumarin, indole, benzimidazole, benzofuran, or acridine. Additionally, the second aromatic ring group may be a combination of a plurality of these aromatic compounds. An example thereof is a group in which two hydrogen atoms are removed from an aromatic ring assembly compound, such as biphenyl, binaphthalene, bipyridine, bithiophene, phenylpyridine, phenylthiophene, terphenyl, diphenylthiophene, or quaterphenyl.

In this case, the second aromatic ring group may have a substituent. Examples of the "substituent on the second aromatic ring group" include the same as those of the "substituent on the first aromatic ring" described above.

Each X described above is independently an oxygen atom, a sulfur atom, a substituted or unsubstituted alkylene, a substituted or unsubstituted cycloalkylene, or an aralkylene.

Examples of the alkylene include, but are not particularly limited to, methylene, ethylene, propylene, 1-methylmethylene, 1,1-dimethylmethylene, 1-methylethylene, 1,1-dimethylethylene, 1,2-dimethylethylene, propylene, butylene, 1-methylpropylene, 2-methylpropylene, pentylene, and hexylene.

Examples of the cycloalkylene include, but are not particularly limited to, cyclopropylene, cyclobutylene, cyclopentylene, cyclohexylene, cyclopentylene, cycloheptylene, and cycloalkylenes represented by chemical formulae (2-1) to (2-4) below.

[Chem. 2]

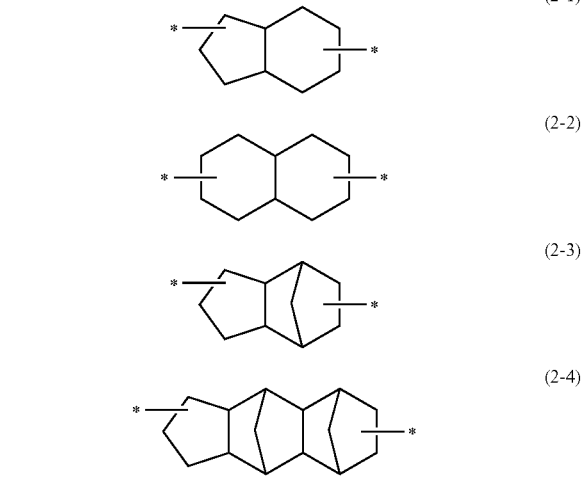

In chemical formulae (2-1) to (2-4), each "*" represents a site that binds to $Ar^1$ or $Ar^2$.

Examples of the aralkylene include, but are not particularly limited to, aralkylenes represented by chemical formulae (3-1) to (3-8) below.

[Chem. 3]

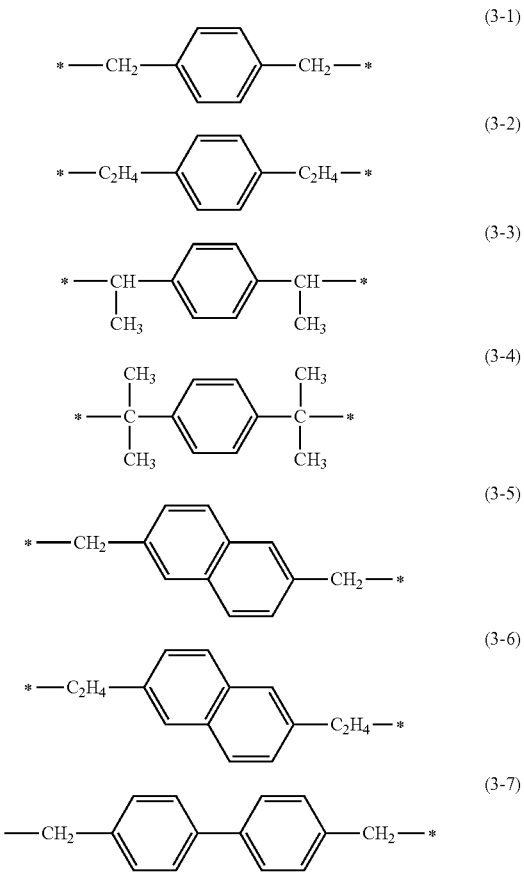

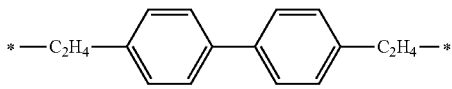
(3-8)

In chemical formulae (3-1) to (3-8), each "*" represents a site that binds to Ara or $Ar^4$.

Each of the alkylene, the cycloalkylene, and the aralkylene may have a substituent. In this case, examples of the "substituent on X" include the same as those of the "substituent on the first aromatic ring" described above.

Among those described above, X is preferably a substituted or unsubstituted cycloalkylene having 1 to 20 carbon atoms or an aralkylene having 8 to 20 carbon atoms, more preferably a substituted or unsubstituted cycloalkylene having 1 to 20 carbon atoms, even more preferably a cycloalkylene represented by formula (2-3) or (2-4). Preferably, X is a substituted or unsubstituted cycloalkylene having 1 to 20 carbon atoms or an aralkylene having 8 to 20 carbon atoms because the increase of a non-polar moiety results in a lower dielectric loss tangent and because the long distance between cross-linking points can result in a reduction in internal stress to increase the adhesion. More preferably, X is a substituted or unsubstituted cycloalkylene having 1 to 20 carbon atoms because a lower polarity results in an even lower dielectric loss tangent and because the adhesion can be further increased.

n is an integer of 0 to 10, preferably 0 to 8, preferably 0 to 5. When the compound represented by chemical formula (1) is an oligomer or a polymer, n represents an average value.

At least two hydrogen atoms of $Ar^1$ and $Ar^2$ are replaced with hydroxy groups.

Specific examples of the compound represented by chemical formula (1) include, but are not particularly limited to, various bisphenol compounds, compounds represented by chemical formulae (4-1) to (4-8) below, and compounds having one or more polymerizable unsaturated bond-containing substituents on these aromatic nuclei.

[Chem. 4]

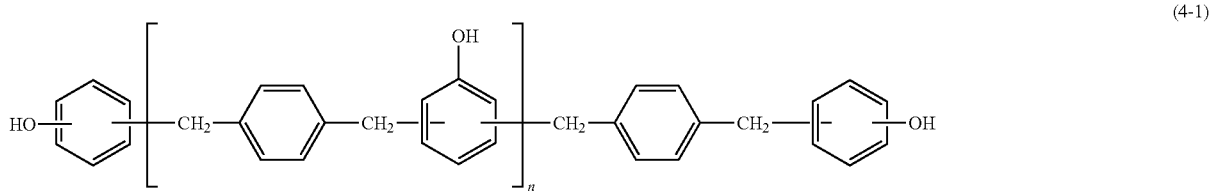
(4-1)

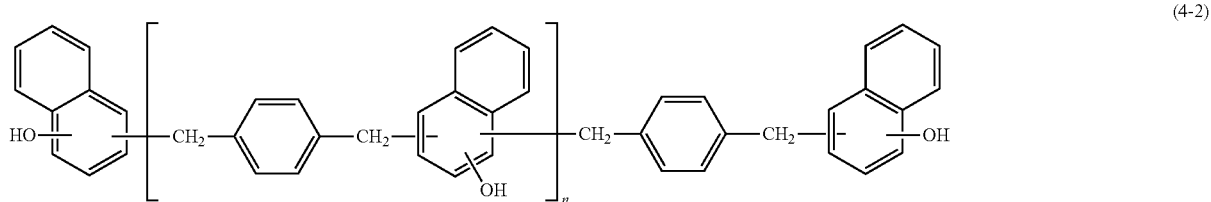
(4-2)

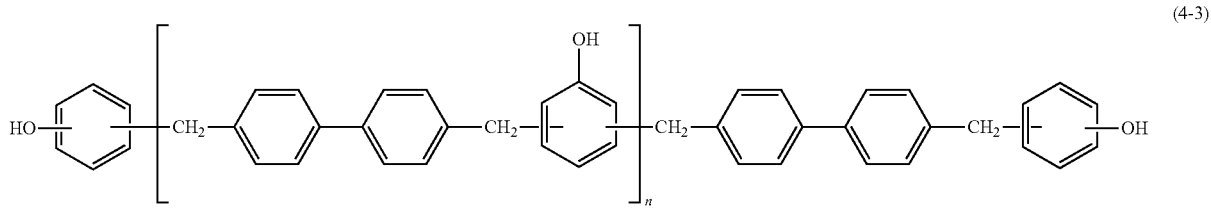
(4-3)

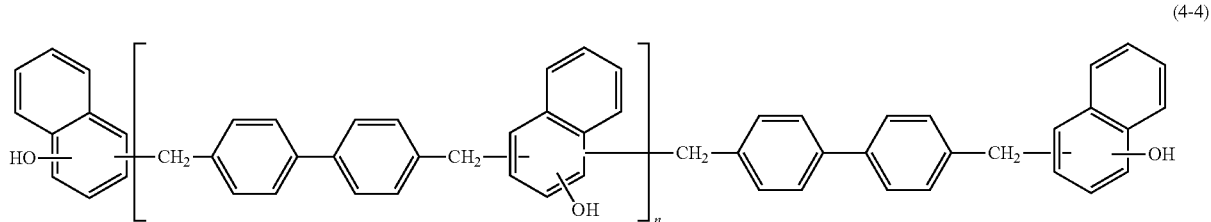
(4-4)

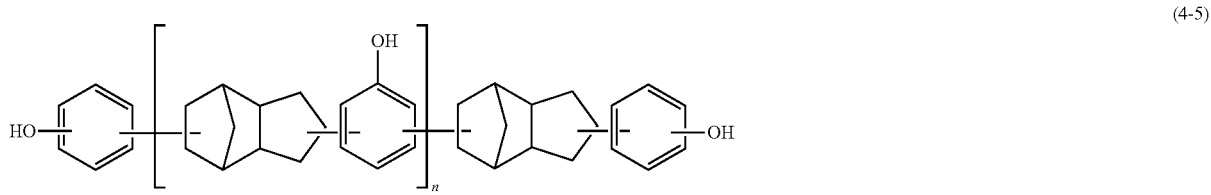
(4-5)

(4-6)
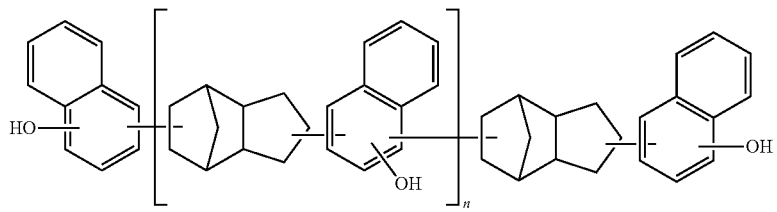

(4-7)
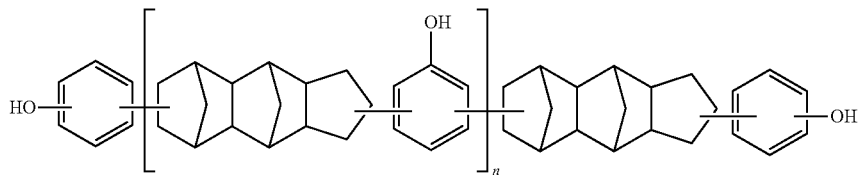

(4-8)
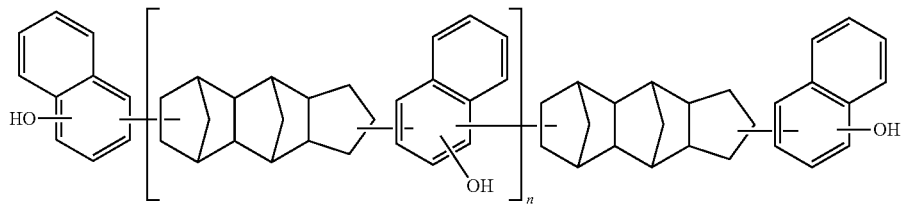

Examples of the various bisphenol compounds described above include bisphenol A, bisphenol AP, bisphenol B, bisphenol E, bisphenol F, and bisphenol Z.

In chemical formulae (4-1) to (4-8), each n is 0 to 10, preferably 0 to 5. In this case, when the compounds represented by chemical formulae (4-1) to (4-8) are oligomers or polymers, each n represents an average value. In the present specification, the term "oligomer" refers to a compound having 1 to 5 repeat units, and the term "polymer" refers to a compound having 6 or more repeat units. The substitution positions of the hydroxy groups that are substituents on the aromatic rings may be freely selected. In the case of naphthalene rings, each of the hydroxy groups may be attached to any of rings that bind to other moieties and rings that do not bind to other moieties.

In an embodiment, the first aromatic compound containing the first aromatic ring represented by chemical formula (1) can be synthesized by the reaction of a divinyl compound or a dialkyloxymethyl compound with a compound in which at least one hydrogen atom of the first aromatic ring is replaced with a hydroxy group.

In this case, examples of the divinyl compound and the dialkyloxymethyl compound include, but are not particularly limited to, aliphatic diene compounds, such as 1,3-butadiene, 1,5-hexadiene, dicyclopentadiene, tricyclopentadiene, tetracyclopentadiene, pentacyclopentadiene, and hexacyclopentadiene; aromatic diene compounds, such as divinylbenzene and divinylbiphenyl; and dialkyloxymethyl compounds, such as dimethoxymethylbenzene, dimethoxymethylbiphenyl, methoxy adducts of bisphenol A, ethoxy adducts of bisphenol A, methoxy adducts of bisphenol F, and ethoxy adducts of bisphenol F.

These first aromatic compounds each having two or more phenolic hydroxy groups may be used alone or in combination of two or more.

The first aromatic compound preferably has a hydroxyl equivalent of 130 to 500 g/eq., more preferably 130 to 400 g/eq. A hydroxyl equivalent of 130 g/eq. or more of the first aromatic compound results in higher heat resistance and is thus preferred. A hydroxyl equivalent of 500 g/eq. or less of the first aromatic compound results in a better balance between the heat resistance and the dielectric loss tangent.

In the case where the first aromatic compound is represented by chemical formula (1) and where n is a value corresponding to an oligomer or a polymer, the weight-average molecular weight is preferably 200 to 3,000, more preferably 200 to 2,000. A weight-average molecular weight of 200 or more of the first aromatic compound results in a better dielectric loss tangent and is thus preferred. A weight-average molecular weight of 3,000 or less of the first aromatic compound results in good formability and is thus preferred. As the value of the "weight-average molecular weight" in the present specification, a value measured by a method described below is used. Specifically, a value obtained by gel permeation chromatography (GPC) measurement under conditions below is used.

Measurement Conditions of GPC
Measurement instrument: "HLC-8320 GPC", available from Tosoh Corporation
Column: guard column "HXL-L", available from Tosoh Corporation
+"TSK-GEL G4000HXL", available from Tosoh Corporation
+"TSK-GEL G3000HXL", available from Tosoh Corporation
+"TSK-GEL G2000HXL", available from Tosoh Corporation
+"TSK-GEL G2000HXL", available from Tosoh Corporation
Detector: RI (differential refractometer)
Data processing: "GPC Workstation EcoSEC-WorkStation", available from Tosoh Corporation
Column temperature: 40° C.
Developing solvent: tetrahydrofuran
Flow rate: 1.0 ml/minute Standard: monodisperse polystyrenes having known molecular weights, described below, were used in accordance with the measurement manual of "GPC-8320 GPC".

Polystyrene Used:
"A-500", available from Tosoh Corporation
"A-1,000", available from Tosoh Corporation
"A-2,500", available from Tosoh Corporation
"A-5,000", available from Tosoh Corporation
"F-1", available from Tosoh Corporation
"F-2", available from Tosoh Corporation
"F-4", available from Tosoh Corporation
"F-10", available from Tosoh Corporation
"F-20", available from Tosoh Corporation
"F-40", available from Tosoh Corporation
"F-80", available from Tosoh Corporation
"F-128", available from Tosoh Corporation Sample: a filtrate (50 μl) obtained by filtering a 1.0% by mass solution in tetrahydrofuran with a microfilter in terms of the resin solid content

[Second Aromatic Compound]

The second aromatic compound has a phenolic hydroxy group. The second aromatic compound has one phenolic hydroxy group and thus has the function of terminating the polyesterification reaction of the foregoing first aromatic compound, and the third aromatic compound and so forth, described below.

Examples of the second aromatic compound include, but are not particularly limited to, compounds each containing one phenolic hydroxy group on a substituted or unsubstituted second aromatic ring having 3 to 30 carbon atoms.

Examples of the second aromatic ring having 3 to 30 carbon atoms include, but are not particularly limited to, monocyclic aromatic rings, fused aromatic rings, aromatic ring assemblies, and aromatic rings linked by an alkylene. Examples of the monocyclic aromatic rings, the fused aromatic rings, and the aromatic ring assemblies include the same as those of the first aromatic ring described above.

Examples of the aromatic rings linked by an alkylene include diphenylmethane, diphenylethane, 1,1-diphenylethane, 2,2-diphenylpropane, naphthylphenylmethane, triphenylmethane, dinaphthylmethane, dinaphthylpropane, phenylpyridylmethane, fluorene, and diphenylcyclopentane.

The second aromatic ring in the second aromatic compound may have a substituent. In this case, examples of the "substituent on the second aromatic ring" include the same as those of the "substituent on the first aromatic ring" described above.

As described above, one hydrogen atom on the substituted or unsubstituted second aromatic ring in the second aromatic compound is replaced with a hydroxy group.

Examples of the second aromatic compound include compounds represented by chemical formulae (5-1) to (5-17).

[Chem. 5]

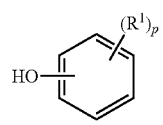 (5-1)

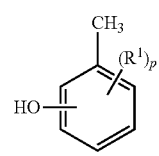 (5-2)

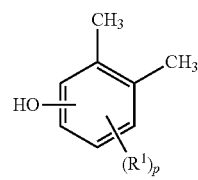 (5-3)

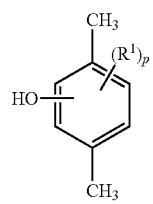 (5-4)

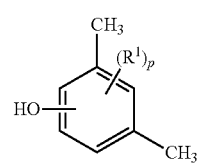 (5-5)

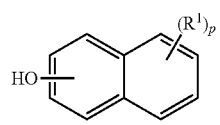 (5-6)

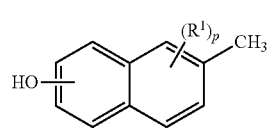 (5-7)

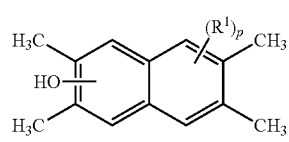 (5-8)

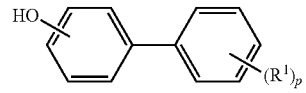 (5-9)

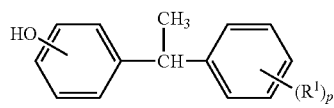 (5-10)

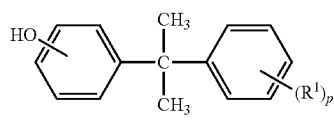 (5-11)

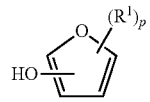 (5-12)

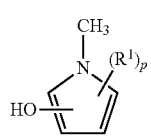 (5-13)

-continued

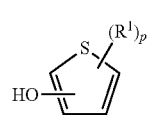
(5-14)

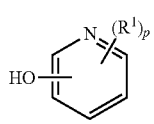
(5-15)

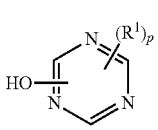
(5-16)

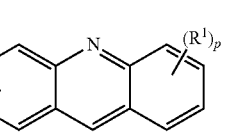
(5-17)

In chemical formulae (5-1) to (5-17), each $R^1$ is a polymerizable unsaturated bond-containing substituent. In this case, the polymerizable unsaturated bond-containing substituent is the same as described above. Each p is an integer of 0 or 1 or more, preferably 1 to 3, more preferably 1 or 2, even more preferably 1. In the case where p is 2 or more, binding positions on an aromatic ring are freely selected. For example, in the cases of the naphthalene ring in chemical formula (5-6) and the heterocyclic ring in chemical formula (5-17), any ring may be substituted. In the case of chemical formula (5-9) or the like, any of the benzene rings present in one molecule may be substituted. The number of substituents in one molecule is p.

Specific examples of the second aromatic compound include, but are not particularly limited to, compounds each including a monocyclic aromatic ring serving as the aromatic ring (hereinafter, also referred to simply as "second monocyclic aromatic ring compounds), such as phenol, cresol, xylenol, o-allylphenol, m-allylphenol, p-allylphenol, 2,4-diallylphenol, 2,6-diallylphenol, 2-allyl-4-methylphenol, 2-allyl-6-methylphenol, 2-allyl-4-methoxy-6-methylphenol, 2-propargylphenol, 3-propargylphenol, and 4-propargylphenol; compounds each including a fused aromatic ring serving as the aromatic ring (hereinafter, also referred to simply as "second fused aromatic ring compounds"), such as 1-naphthol, 2-naphthol, 2-allyl-1-naphthol, 3-allyl-1-naphthol, 1-allyl-2-naphthol, 3-allyl-2-naphthol, 5-allyl-1-naphthol, 6-allyl-1-naphthol, diallylnaphthol, 2-allyl-4-methoxy-1-naphthol, 2-propargyl-1-naphthol, 3-propargyl-1-naphthol, 1-propargyl-2-naphthol, and 3-propargyl-2-naphthol; and compounds each including an aromatic ring assembly serving as the aromatic ring (hereinafter, also referred to simply as a "second aromatic ring assembly compound"), such as allylhydroxybiphenyl and hydroxypropargylbiphenyl.

Among those described above, the second aromatic compound is preferably the second monocyclic aromatic ring compound or the second fused aromatic ring compound, more preferably o-allylphenol, m-allylphenol, p-allylphenol, 2-allyl-1-naphthol, 3-allyl-1-naphthol, 1-allyl-2-naphthol, 3-allyl-2-naphthol, 5-allyl-1-naphthol, or 6-allyl-1-naphthol.

The second aromatic compound according to another embodiment is preferably the second fused aromatic ring compound (fused aromatic ring compound), more preferably 2-allyl-1-naphthol, 3-allyl-1-naphthol, 1-allyl-2-naphthol, 3-allyl-2-naphthol, 5-allyl-1-naphthol, or 6-allyl-1-naphthol. In the case where the second aromatic compound is the fused aromatic ring compound, the suppression of molecular motion due to steric hindrance can result in a lower dielectric loss tangent, which is preferred. From the viewpoint of achieving high handleability and low viscosity of the aromatic ester compound (A), for example, 2-allylphenol having a benzene ring skeleton is preferred. From the viewpoint of enabling the resulting cured product to have higher heat resistance and a good balance with low dielectric properties, for example, 2-allyl-1-naphthol or 1-allyl-2-naphthol having a naphthalene ring skeleton is preferred.

These second aromatic compounds may be used alone or in combination of two or more.

[Third Aromatic Compound and/or Acid Halide Thereof or Esterified Compound Thereof]

The third aromatic compound and/or an acid halide thereof or an esterified compound thereof is a carboxylic acid having two or more carboxy groups or a derivative thereof, such as an acid halide or an esterified compound (in the present specification, the third aromatic compound and/or an acid halide thereof or an esterified compound thereof is also referred to collectively as a "third aromatic compound and so forth"). The third aromatic compound and so forth have two or more carboxy groups and so forth and thus can react with the first aromatic compound to form a polyester structure in the aromatic ester resin (A). Note that a reaction with the second aromatic compound terminates the polyesterification reaction.

Examples of the third aromatic compound and so forth include, but are not particularly limited to, compounds each containing two or more carboxy groups and so forth on a substituted or substituted third aromatic ring having 3 to 30 carbon atoms.

Examples of the "carboxy groups and so forth" include a carboxy group; acyl halide groups, such as acyl fluoride groups, acyl chloride groups, and acyl bromide groups; alkyloxycarbonyl groups, such as a methyloxycarbonyl group and an ethyloxycarbonyl group; and aryloxycarbonyl groups, such as a phenyloxycarbonyl group and a naphthyloxycarbonyl group. When an acyl halide group is contained, the third aromatic compound is an acid halide. When an alkyloxycarbonyl group or an aryloxycarbonyl group is contained, the third aromatic compound can be an esterified compound. Among these, the third aromatic compound preferably has a carboxy group, an acyl halide group, or an aryloxycarbonyl group, more preferably a carboxy group or an acyl halide group, even more preferably a carboxy group, an acyl chloride group, or an acyl bromide group.

Examples of the third aromatic compound and so forth include, but are not particularly limited to, compounds each containing two or more carboxy groups and so forth on the substituted or unsubstituted third aromatic ring having 3 to 30 carbon atoms.

Examples of the third aromatic ring include, but are not particularly limited to, monocyclic aromatic rings, fused aromatic rings, aromatic ring assemblies, and aromatic rings linked by an alkylene. Examples of the monocyclic aromatic rings, the fused aromatic rings, the aromatic ring assemblies, and the aromatic rings linked by an alkylene include the same as those of the first aromatic ring and the second aromatic ring.

The third aromatic ring according to the third aromatic compound and so forth may have a substituent. In this case, examples of the "substituent of the third aromatic ring"

include the same as those of the "substituent on the first aromatic ring" described above.

Specific examples of the third aromatic compound and so forth include compounds represented by chemical formulae (6-1) to (6-15) below.

[Chem. 6]

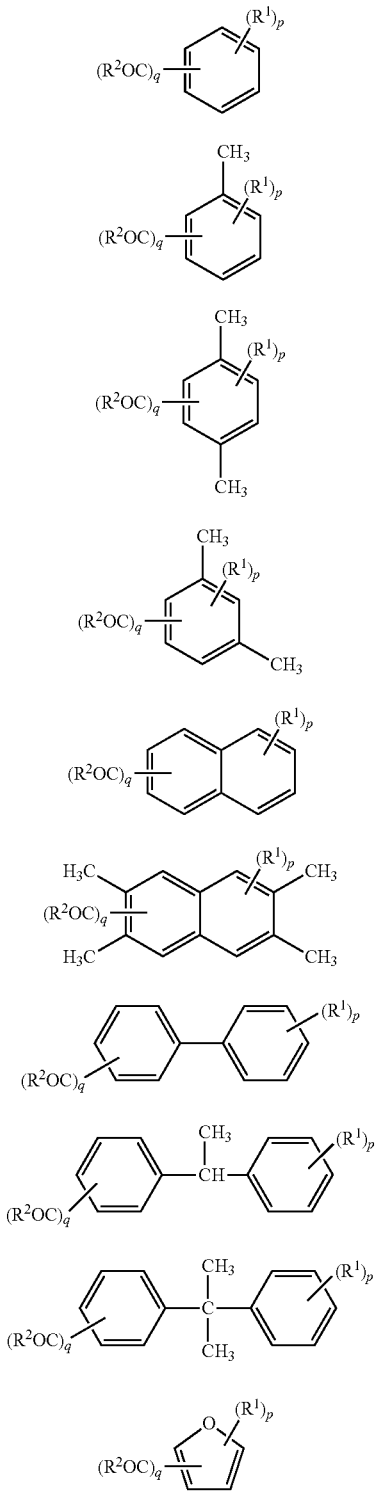

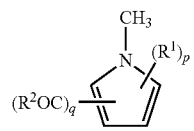

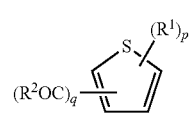

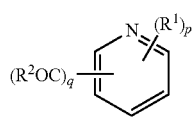

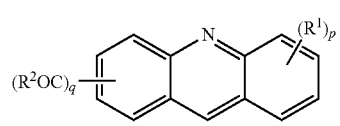

In chemical formulae (6-1) to (6-15), each $R^1$ is a polymerizable unsaturated bond-containing substituent. In this case, the polymerizable unsaturated bond-containing substituent is the same as described above. Each $R^2$ is a hydroxy group, a halogen atom, an alkyloxy group, or an aryloxy group. p is an integer of 0 or 1 or more, preferably 0 or 1 to 3, more preferably 0 or 1, even more preferably 0. q is 2 or 3. In the case where each of p and q is 2 or more, binding positions on an aromatic ring are freely selected. For example, in the cases of the naphthalene ring in chemical formula (6-5) and the heterocyclic ring in chemical formula (6-15), any ring may be substituted. In the case of chemical formula (6-7) or the like, any of the benzene rings present in one molecule may be substituted. The number of substituents in one molecule is p and q.

Specific examples of the third aromatic compound and so forth include, but are not particularly limited to, benzenedicarboxylic acids, such as isophthalic acid, terephthalic acid, 5-allylisophthalic acid, and 2-allylterephthalic acid; benzenetricarboxylic acids, such as trimellitic acid and 5-allyltrimellitic acid; naphthalenedicarboxylic acids, such as naphthalene-1,5-dicarboxylic acid, naphthalene-2,3-dicarboxylic acid, naphthalene-2,6-dicarboxylic acid, naphthalene-2, 7-dicarboxylic acid, 3-allylnaphthalene-1,4-dicarboxylic acid, and 3,7-diallylnaphthalene-1,4-dicarboxylic acid; pyridinetricarboxylic acids, such as 2,4,5-pyridinetricarboxylic acid; triazinecarboxylic acids, such as 1,3,5-triazine-2,4,6-tricarboxylic acid; acid halides thereof; and esterified compounds thereof. Among these, the third aromatic compound and so forth are preferably benzenedicarboxylic acid or benzenetricarboxylic acid, more preferably isophthalic acid, terephthalic acid, isophthaloyl chloride, terephthaloyl chloride, 1,3,5-benzenetricarboxylic acid, or 1,3,5-benzenetricarbonyl trichloride, even more preferably isophthaloyl chloride, terephthaloyl chloride, or 1,3,5-benzenetricarbonyl trichloride.

Among those described above, the third aromatic compound and so forth preferably have a monocyclic aromatic ring as the aromatic ring, and the third aromatic compound and so forth preferably have a fused aromatic ring as the aromatic ring. Benzenedicarboxylic acid, benzenetricarboxylic acid, naphthalenedicarboxylic acid, or an acid halide thereof is preferred. Benzenedicarboxylic acid, naphthalenedicarboxylic acid, or an acid halide thereof is more preferred. Isophthalic acid, terephthalic acid, naphthalene-1,5-dicarboxylic acid, naphthalene-2, 3-dicarboxylic acid, naphthalene-2,6-dicarboxylic acid, naphthalene-2,7-dicarboxylic acid, or an acid halide thereof is even more preferred.

These third aromatic compound and so forth described above may be used alone or in combination of two or more.

[Structure of Aromatic Ester Resin (A)]

At least one of the first aromatic compound, the second aromatic compound, and the third aromatic compound and/or the acid halide thereof or the esterified compound thereof (third aromatic compound and so forth) has a polymerizable unsaturated bond-containing substituent. That is, each of the first aromatic compound, the second aromatic compound, and the third aromatic compound and so forth may have the polymerizable unsaturated bond-containing substituent. Each of the first aromatic compound and the second aromatic compound may have the polymerizable unsaturated bond-containing substituent. Only the second aromatic compound may have the polymerizable unsaturated bond-containing substituent. In the case where two or more types of the first aromatic compound, the second aromatic compound, and the third aromatic compound are used, only a subset thereof may have the polymerizable unsaturated bond-containing substituent.

At least the second aromatic compound according to an embodiment preferably has the polymerizable unsaturated bond-containing substituent. As described above, a structure originating from the second aromatic compound is located at a molecular end of the aromatic ester resin (A). As a result, the polymerizable unsaturated bond-containing substituent of the second aromatic compound is also arranged at the molecular end of the aromatic ester resin (A). This is preferred because the balance between the heat resistance and the dielectric loss tangent of a cured product to be obtained can be further increased.

The aromatic ester resin (A), as described above, is a reaction product of the first aromatic compound, the second aromatic compound, and the third aromatic compound and can contain various compounds. The structure of the aromatic ester resin (A) can be controlled by, for example, appropriately changing the amounts of the first aromatic compound, the second aromatic compound, and the third aromatic compound used and reaction conditions.

In principle, the aromatic ester resin (A) according to the embodiment does not have a hydroxy group in the molecule of a resin to be obtained. However, a hydroxy group-containing compound may be contained as a by-product in reaction products as long as the effect of the present invention is not inhibited.

The aromatic ester resin (A) according to an embodiment contains a compound represented by chemical formula (7) below.

[Chem. 7]

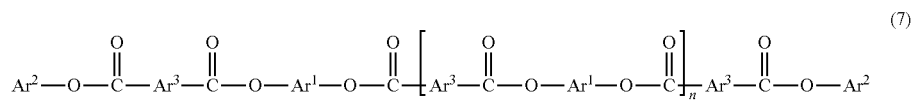

(7)

In chemical formula (7), each $Ar^1$ has a structure originating from the first aromatic compound, each $Ar^2$ has a structure originating from the second aromatic compound, and $Ar^3$ has a structure originating from the third aromatic compound. n is 0 to 10. When the aromatic ester resin (A) is an oligomer or a polymer, n represents an average value.

For example, each $Ar^1$ is independently a group in which two or more hydrogen atoms are removed from the substituted or unsubstituted first aromatic ring or a group in which two or more hydrogen atoms are removed from a structure in which the first aromatic rings are linked by a linking group.

For example, each $Ar^2$ is independently a group in which one hydrogen atom is removed from the substituted or unsubstituted second aromatic ring.

For example, each $Ar^3$ is a group in which two or more hydrogen atoms are removed from the substituted or unsubstituted third aromatic ring.

At least one of $Ar^1$, $Ar^2$, and $Ar^3$ has a polymerizable unsaturated bond-containing substituent.

In this case, when the first aromatic compound has three or more phenolic hydroxy groups, each $Ar^1$ can have a more branched structure.

When the third aromatic compound has two or more carboxy groups, each $Ar^3$ can have a more branched structure.

Examples of a compound contained in the aromatic ester resin (A) according to an embodiment include compounds represented by chemical formulae (7-1) to (7-10) below.

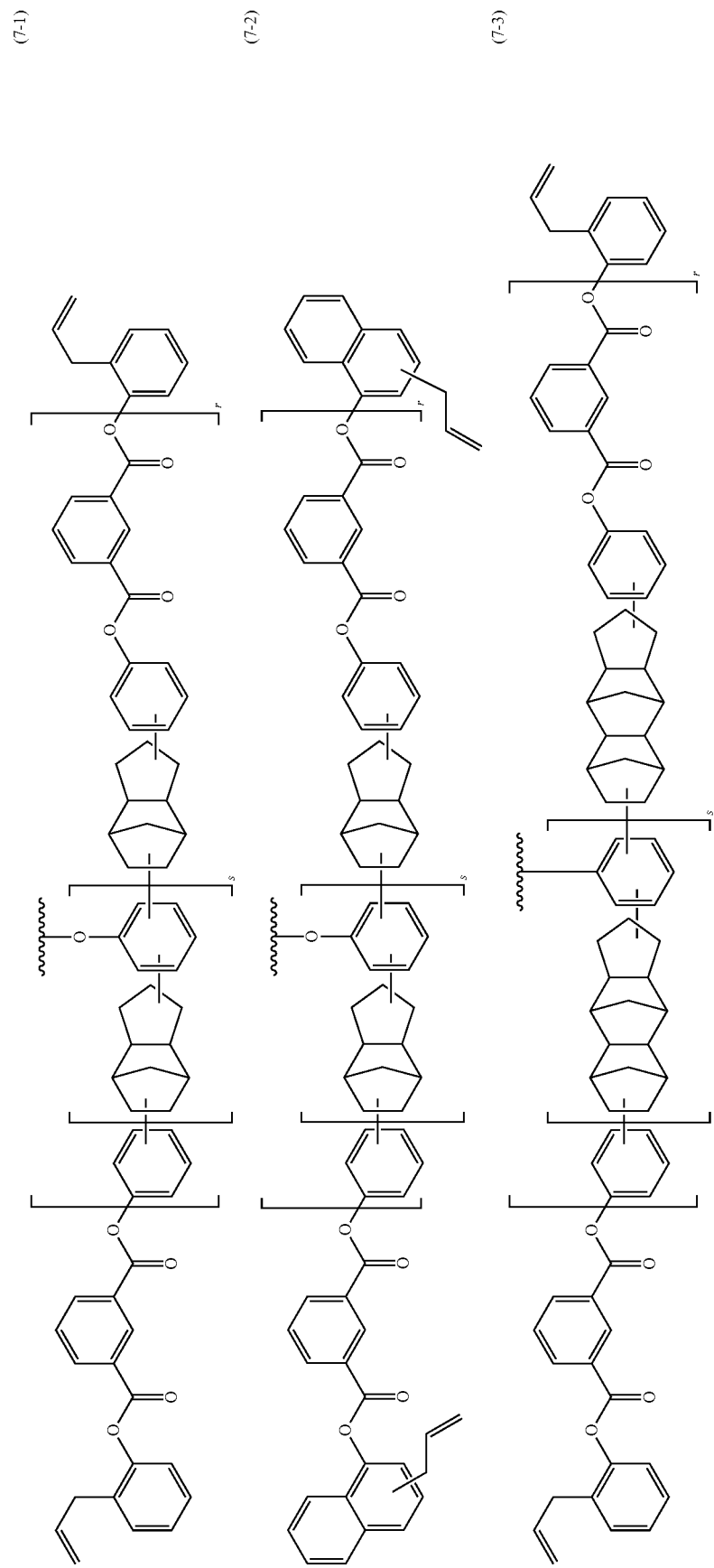

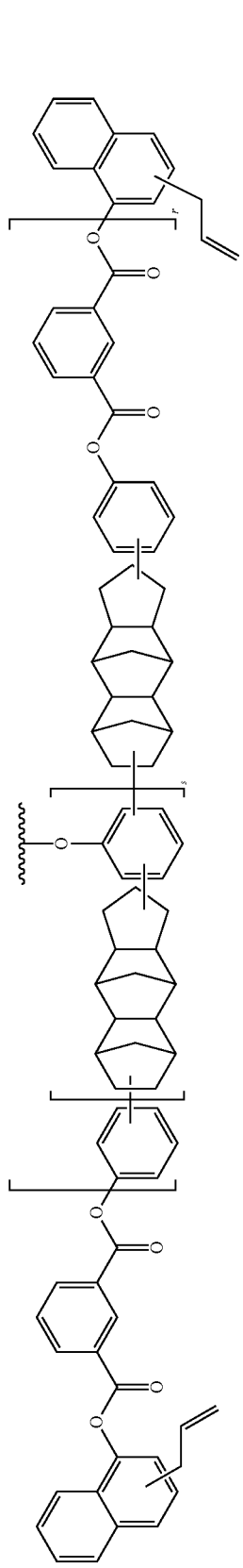
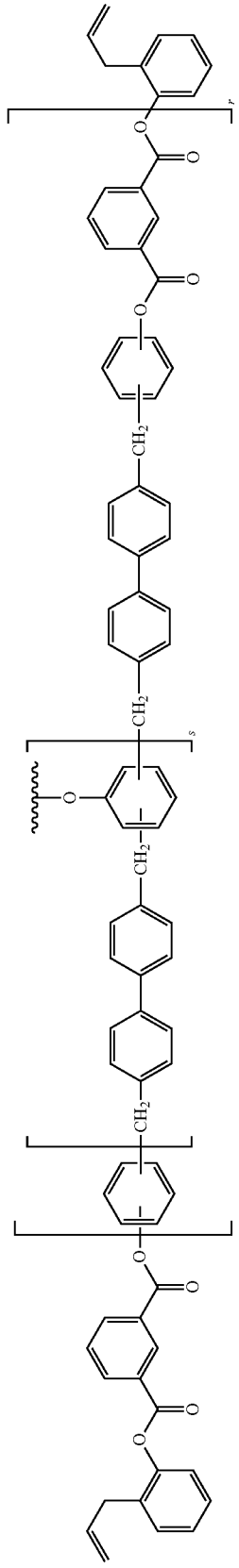
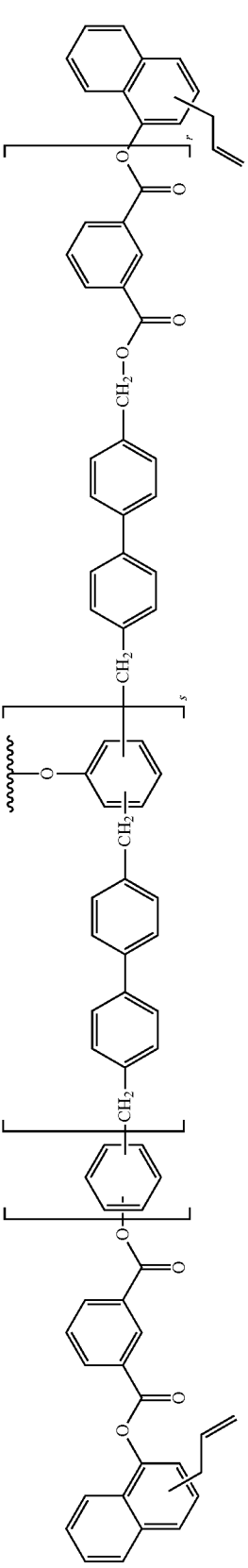
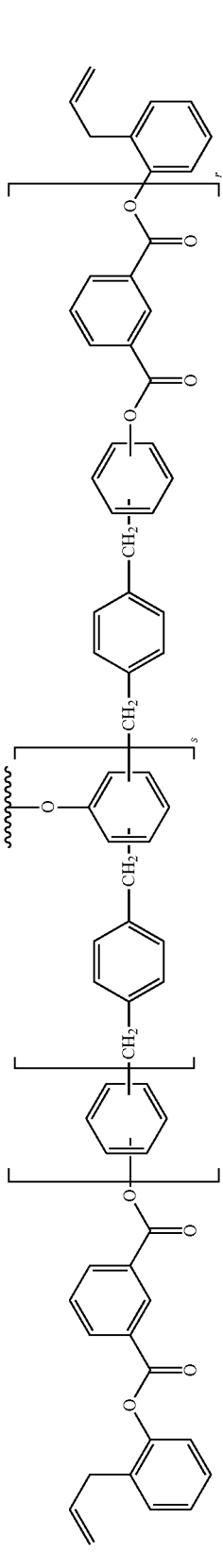

-continued
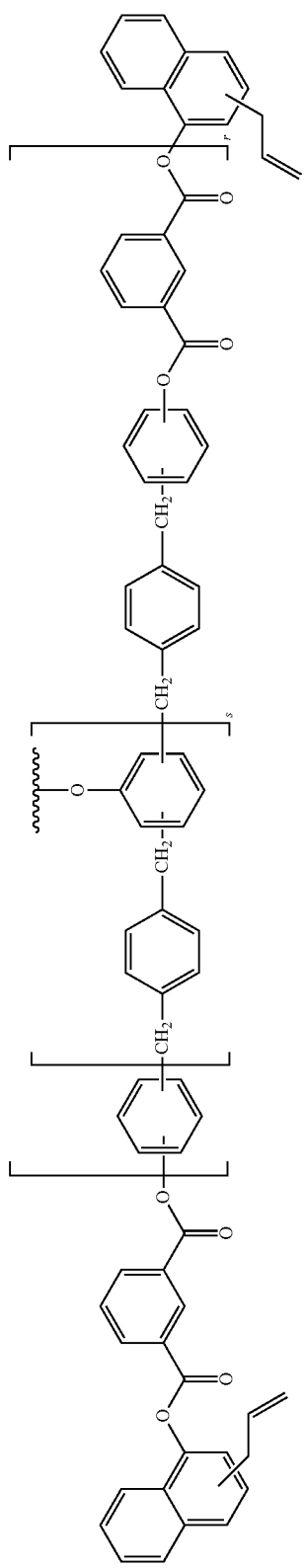
(7-8)
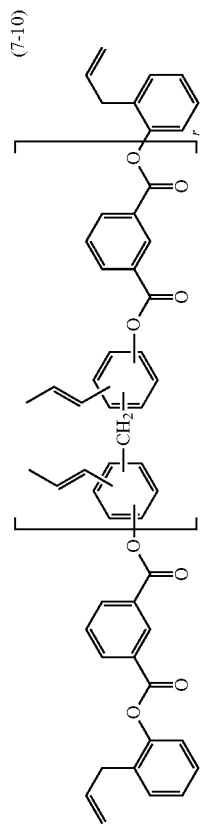
(7-10)
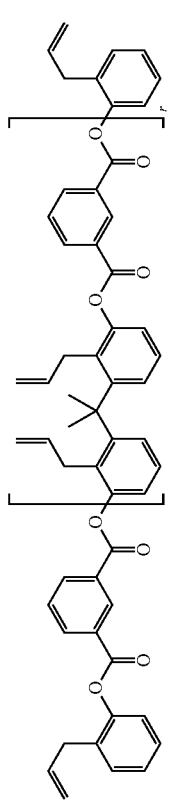
(7-9)
[Chem. 10]

In chemical formulae (7-1) to (7-10), s is 0 to 10, preferably 0 to 5, and r is 1 to 10. When the compound represented by each of chemical formulae (7-1) to (7-10) is an oligomer or a polymer, s1, s2, and r each represent an average value. Broken lines in the chemical formulae represent structures obtained by the reaction of a compound corresponding to Ara with a compound corresponding to $Ar^1$ and/or $Ar^2$.

The aromatic ester compound (A-2) preferably has a weight-average molecular weight of 150 to 3,000, more preferably 200 to 2,000. A weight-average molecular weight of 800 or more results in a good dielectric loss tangent and is thus preferred. A weight-average molecular weight of 500 or less results in good formability and is thus preferred. Additionally, the number-average molecular weight is preferably in the range of 150 to 1,500 because of the same reasons.

<Method for Producing Aromatic Ester Resin (A)>

A method for producing the aromatic ester resin (A) is not particularly limited. The aromatic ester resin (A) can be produced by an appropriate known method.

The method according to an embodiment for producing the aromatic ester resin (A) includes a step of reacting the first aromatic compound, the second aromatic compound, and the third aromatic compound.

(First Aromatic Compound, Second Aromatic Compound, and Third Aromatic Compound and so Forth)

As the first aromatic compound, the second aromatic compound, and the third aromatic compound and so forth, those described above are used.

In an embodiment, the structure of the resulting aromatic ester resin (A) can be controlled by appropriately adjusting the amounts of the first aromatic compound, the second aromatic compound, and the third aromatic compound and so forth used.

For example, the ratio of the number of moles of the carboxy groups and so forth of the third aromatic compound to the number of moles of the hydroxy groups of the first aromatic compound (carboxy groups and so forth/hydroxy groups of first aromatic compound) is preferably 0.5 to 10, more preferably 0.5 to 6.0, even more preferably 1.0 to 3.0. A ratio of 0.5 or more results in higher heat resistance and is thus preferred. A ratio of 10 or less results in good formability and is thus preferred.

The ratio of the number of moles of the carboxy groups and so forth of the third aromatic compound to the number of moles of the hydroxy groups of the second aromatic compound (carboxy groups and so forth/hydroxy groups of second aromatic compound) is preferably 0.5 to 10, more preferably 1.5 to 4.0. A ratio of 0.5 or more results in good formability and is thus preferred. A ratio of 10 or less results in higher heat resistance and is thus preferred.

In an embodiment, the structure of the resulting aromatic ester resin (A) can be controlled by controlling the reaction sequence.

The method for producing the aromatic ester resin (A) includes (1) a step of reacting the first aromatic compound with the third aromatic compound and (2) a step of reacting the product obtained in the step (1) and the second aromatic compound. In the production method, the reaction can be controlled after a polyester structure is formed, thus providing the aromatic ester resin (A) having a uniform molecular weight distribution.

Additionally, the structure of the resulting aromatic ester resin (A) can be controlled by controlling reaction conditions.

The pH during the reaction is preferably, but not particularly limited to, 11 or more. In this case, the pH can be adjusted with an acid, such as hydrochloric acid, sulfuric acid, nitric acid, or acetic acid, or a base, such as sodium hydroxide, potassium hydroxide, calcium hydroxide, or ammonia.

The reaction temperature is preferably, but not particularly limited to, 20° C. to 100° C., more preferably 40° C. to 80° C.

The reaction pressure is more preferably, but not particularly limited to, normal pressure.

The reaction time is preferably, but not particularly limited to, 0.5 to 10 hours, more preferably 1 to 5 hours.

The maleimide compound (B) used in the present invention may be a compound having a maleimide group in its molecule. The remaining specific structure is not particularly limited, and various compounds can be used. Among these, a compound having two or more maleimide groups in one molecule is preferred because of excellent curability of the curable composition and excellent heat resistance and dielectric properties of the cured product. Specific examples thereof include a bismaleimide compound having two maleimide groups in one molecule and a polymaleimide compound having three or more maleimide groups in one molecule. The maleimide compound (B) may be used alone or in combination of two or more.

Specific examples of the maleimide compound (B) include compounds represented by structural formula (8) below:

[Chem. 11]

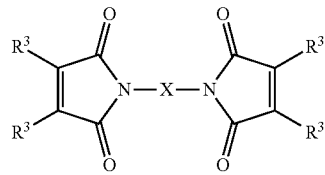

(8)

(where in the formula, X is a divalent organic group, each $R^3$ is any of a hydrogen atom, an aliphatic hydrocarbon group, or a halogen atom, and multiple $R^3$'s present in the formula may be the same or different).

Each $R^3$ in structural formula (8) is any of a hydrogen atom, an aliphatic hydrocarbon group, and a halogen atom. Examples of the aliphatic hydrocarbon group include alkyl groups, such as a methyl group, an ethyl group, a propyl group, a butyl group, a pentyl group, and a hexyl group; cycloalkyl groups, such as a cyclohexyl group; and polymerizable unsaturated bond-containing groups, such as a vinyl group, an allyl group, a propenyl group, an isopropenyl group, and a 1-propenyl group. Examples of the halogen atom include a fluorine atom, a chlorine atom, a bromine atom, an iodine atom.

The specific structure of X in structural formula (8) is not particularly limited and may be any structural moiety. In particular, X is preferably an aromatic ring-containing structural moiety because the resulting curable composition provides a cured product having further excellent heat resistance and dielectric properties. Specific examples of the aromatic ring-containing structural moiety include those represented by any of structural formulae (X-1) to (X-10):

[Chem. 12]

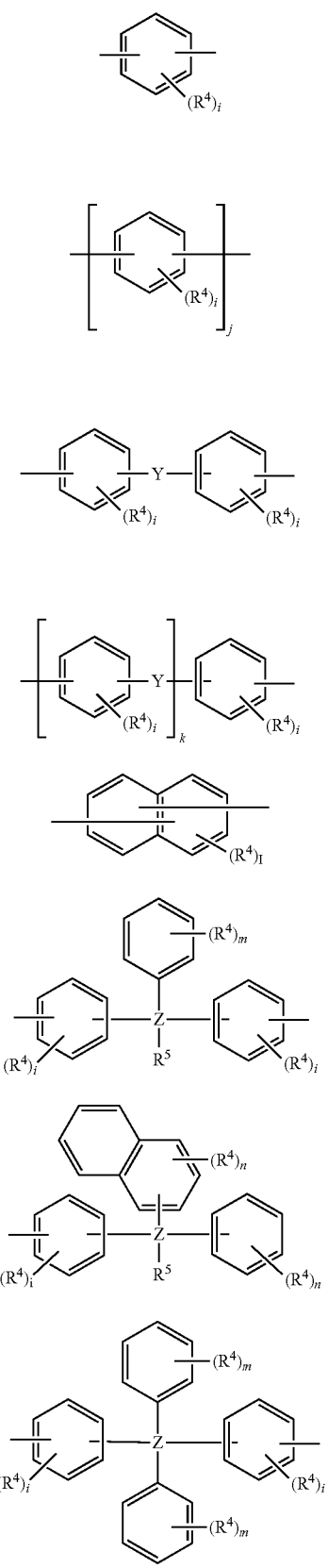

(X-1)
(X-2)
(X-3)
(X-4)
(X-5)
(X-6)
(X-7)
(X-8)

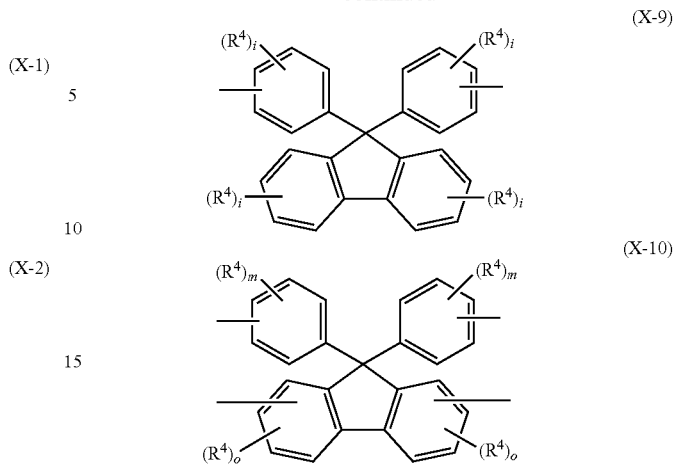

(X-9)
(X-10)

[where in the formulae, each $R^4$ is independently any of a polymerizable unsaturated bond-containing group, an alkyl group, an alkoxy group, a halogen atom, an aryl group, and an aralkyl group, each $R^5$ is any of a hydrogen atom, an alkyl group, a halogenated alkyl group, and a halogen atom, each Y is any of an alkylene group, a halogenated alkylene group, a carbonyl group, a carbonyloxy group, a sulfonyl group, an oxygen atom, and a sulfur atom, multiple Y's present in formula (X-4) may be the same or different, each Z is a carbon atom or a nitrogen atom, Z in formula (X-8) is, however, a carbon atom, each i is 0 or an integer of 1 to 4, l is 0 or an integer of 1 to 6, each m is 0 or an integer of 1 to 5, n is 0 or an integer of 1 to 7, each o is 0 or an integer of 1 to 3, j and k is each an integer of 2 or more, and the binding sites and the positions of the substituents on the naphthalene rings may be any of the carbon atoms constituting the naphthalene rings].

Each $R^4$ in structural formulae (X-1) to (X-10) is any of a polymerizable unsaturated bond-containing group, an alkyl group, an alkoxy group, a halogen atom, an aryl group, and an aralkyl group. Examples of the polymerizable unsaturated bond in the polymerizable unsaturated bond-containing group include a carbon-carbon double bond and a carbon-carbon triple bond. Specific examples of the polymerizable unsaturated bond-containing group having a carbon-carbon double bond include a vinyl group, a vinyloxy group, a (meth)allyl group, a (meth)allyloxy group, a 1-propenyl group, a 1-butenyl group, a 2-butenyl group, a 3-butenyl group, a 1-hexenyl group, a 2-hexenyl group, a 3-hexenyl group, a 4-hexenyl group, a 5-hexenyl group, a 1-octenyl group, 2-octenyl group, a 1-undecenyl group, a 1-pentadecenyl group, a 3-pentadecenyl group, a 7-pentadecenyl group, a 1-octadecenyl group, a 2-octadecenyl group, a cyclopentenyl group, a cyclohexenyl group, a cyclooctenyl group, a 1,3-butadienyl group, a 1,4-butadienyl group, a hexa-1,3-dienyl group, a hexa-2,5-dienyl group, a pentadeca-4,7-dienyl group, a hexa-1,3,5-trienyl group, a pentadeca-1,4,7-trienyl group, a (meth)acrylic group, a (meth)acryloyloxy group, and a (meth)acryloyloxy(poly)alkyleneoxy group. Specific examples of the group having a carbon-carbon triple bond include an ethynyl group, a propargyl group, a 1-butynyl group, a 2-butynyl group, a 3-butynyl group, a 3-pentynyl group, a 4-pentynyl group, and a 1,3-butadiynyl group.

Examples of the alkyl group include alkyl groups, such as a methyl group, an ethyl group, a propyl group, a butyl group, a pentyl group, and a hexyl group; and cycloalkyl groups, such as a cycloalkyl group. Examples of the alkoxy group include a methoxy group, an ethoxy group, a propyloxy group, and a butoxy group. Examples of the halogen atom include a fluorine atom, a chlorine atom, and a bromine atom. Examples of the aryl group include a phenyl group, a naphthyl group, an anthryl group, and structural moieties in which these aromatic nuclei are each substituted with, for example, the polymerizable unsaturated bond-containing group, an alkyl group, an alkoxy group, or a halogen atom. Examples of the aralkyl group include a benzyl group, a phenylethyl group, a naphthylmethyl group, a naphthylethyl group, and structural moieties in which these aromatic nuclei are each substituted with, for example, the polymerizable unsaturated bond-containing group, an alkyl group, an alkoxy group, or a halogen atom.

Among these, $R^4$ is preferably any of a vinyl group, a vinyloxy group, a (meth)allyl group, a (meth)allyloxy group, an alkyl group having 1 to 4 carbon atoms, an alkoxy group having 1 to 4 carbon atoms, a halogen atom, and an aralkyl group having a polymerizable unsaturated bond-containing group because the resulting cured product is excellent in heat resistance and dielectric properties.

Each Y in structural formulae (X-3) and (X-4) is any of an alkylene group, a halogenated alkylene group, a carbonyl group, a carbonyloxy group, a sulfonyl group, an oxygen atom, and a sulfur atom. The number of carbon atoms in each of the alkylene group and the halogenated group is preferably, but not particularly limited to, in the range of 1 to 4.

Preferably, j in structural formula (X-2) is 2 or 3. Preferably, k in structural formula (X-4) is 2 or 3.

Each $R^5$ in structural formulae (X-6) and (X-7) is any of a hydrogen atom, an alkyl group, a halogenated alkyl group, and a halogen atom. The number of carbon atoms in each of the alkyl group and the halogenated alkyl group is preferably, but not particularly limited to, in the range of 1 to 4.

Specific examples of the maleimide compound (B) include compounds represented by structural formulae (9-1) to (9-19) below.

[Chem. 13]

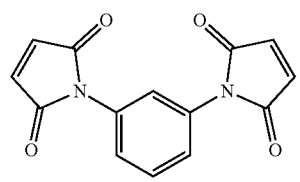
(9-1)

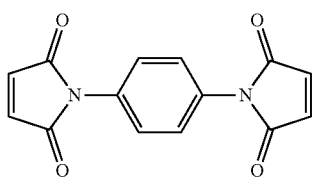
(9-2)

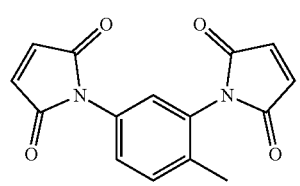
(9-3)

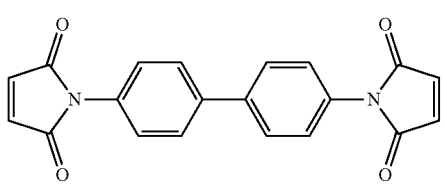
(9-4)

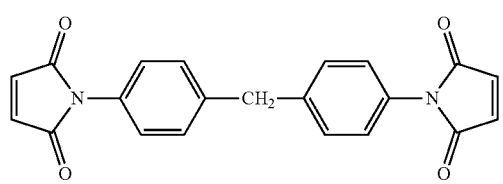
(9-5)

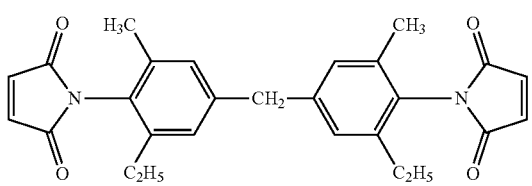
(9-6)

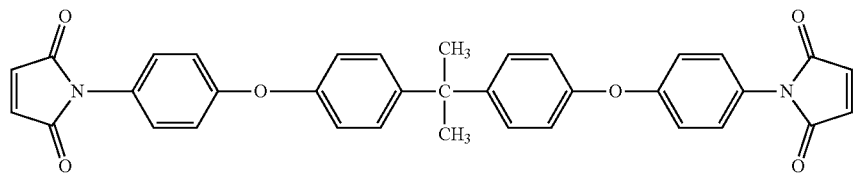
(9-7)

[Chem. 14]
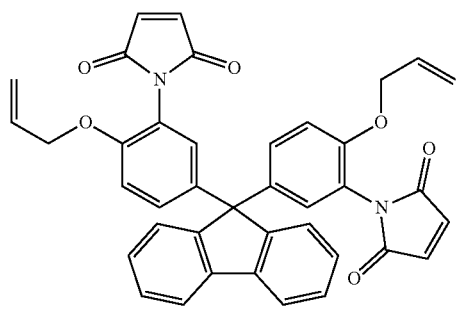 (9-8)
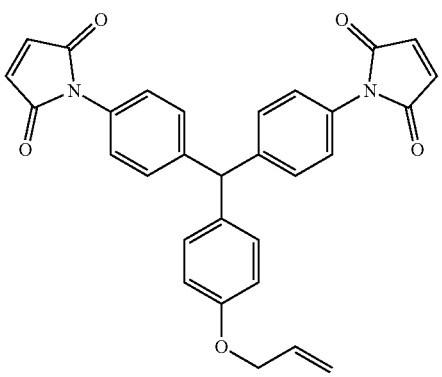 (9-9)
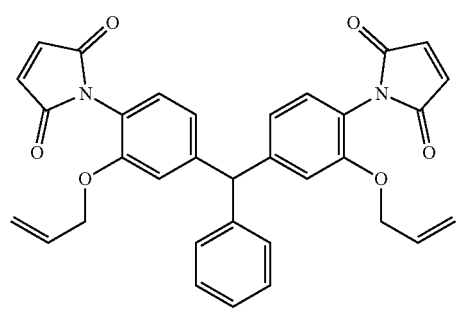 (9-10)
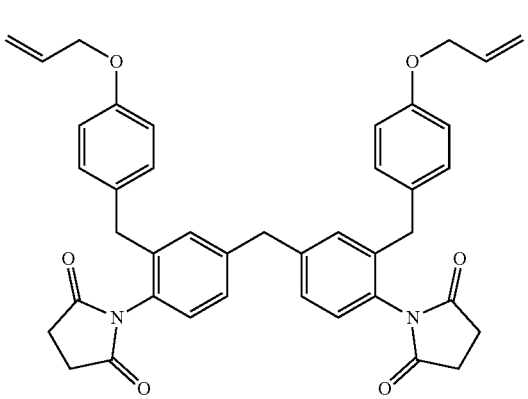 (9-11)
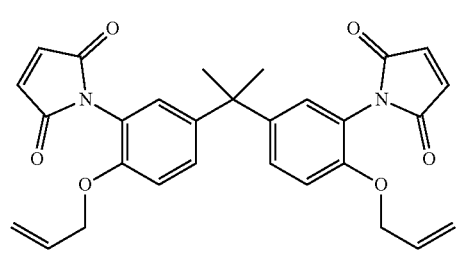 (9-12)
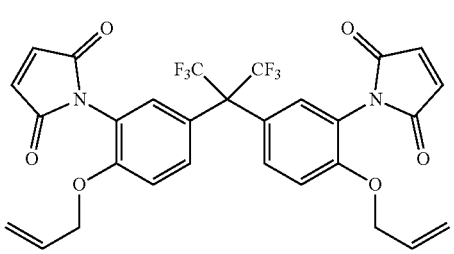 (9-13)
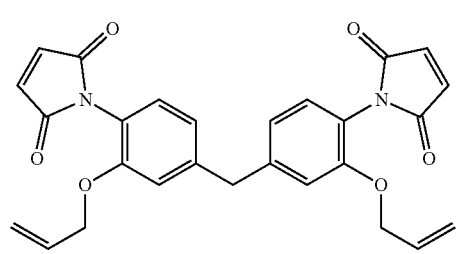 (9-14)
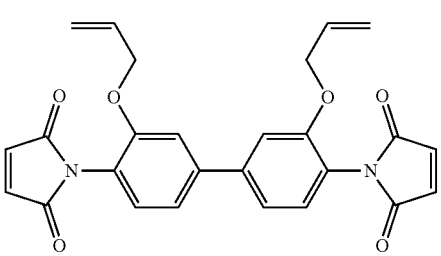 (9-15)
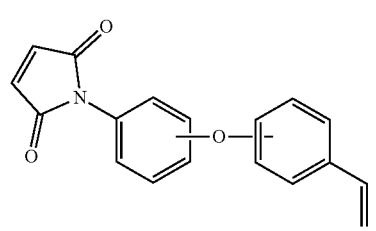 (9-16)
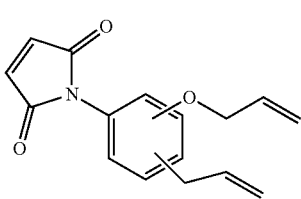 (9-17)

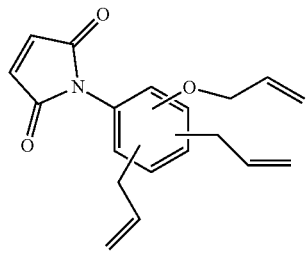
(9-18)

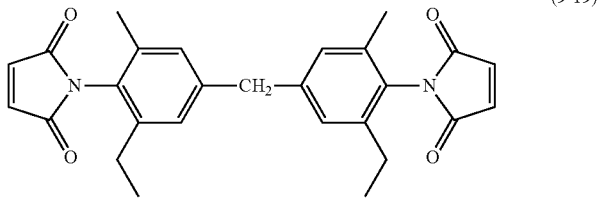
(9-19)

Specific examples of the polymaleimide compound having three or more maleimide groups in one molecule include compounds represented by any of structural formulae (10-1) to (10-3) below:

[Chem. 15]

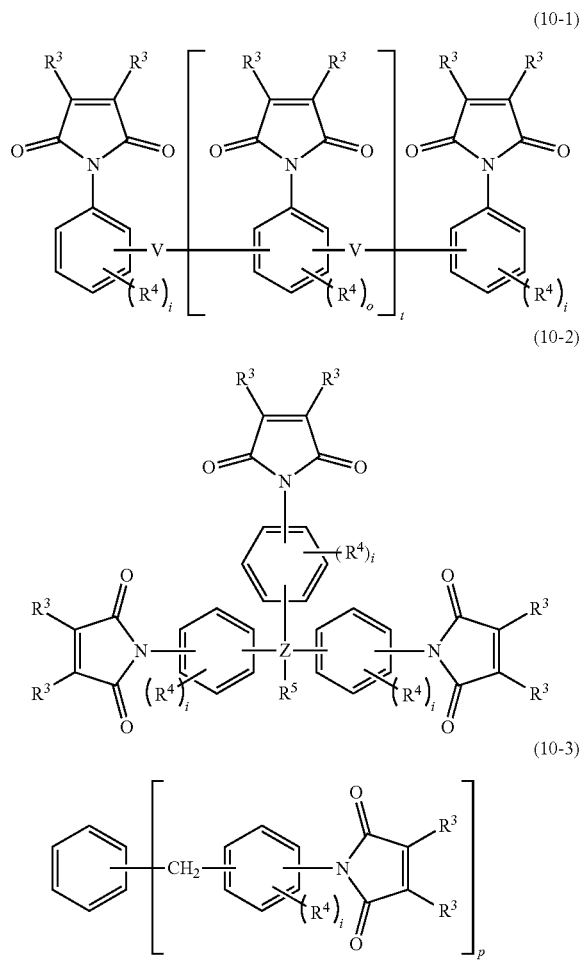

(10-1)

(10-2)

(10-3)

(where in the formulae, each $R^3$ is any of a hydrogen atom, an aliphatic hydrocarbon group, and a halogen atom, multiple $R^3$ present in each of the formulae may be the same or different, each $R^4$ is independently any of a polymerizable unsaturated bond-containing substituent, an alkyl group, an alkoxy group, a halogen atom, an aryl group, and an aralkyl group, each i is 0 or an integer of 1 to 4, o is 0 or an integer of 1 to 3, each V is any of an alkylene group having 1 to 4 carbon atoms, an arylmethylene group, an alkylenearylenealkylene group, an alkylenebiphenylenealkylene group, a cycloalkylene group, an oxygen atom, a sulfur atom, and a carbonyl group, $R^5$ is any of a hydrogen atom, an alkyl group, a halogenated alkyl group, and a halogen atom, Z is a carbon atom or a nitrogen atom, t is an integer of 2 or more, and p is an integer of 3 to 6).

As these maleimide compounds (B), commercially available compounds may be used as they are. Examples thereof include BMI series (for example, BMI-1000, 2000, 2300, 3000, 4000, 6000, 7000, 8000, and TMH) available from Daiwa Kasei Industry Co., Ltd.; BMI, BMI-70, BMI-80, and so forth, available from K.I Chemical Industry Co., Ltd.; and B1109, N1971, B4807, P0778, P0976, available from Tokyo Chemical Industry Co., Ltd.

Among these maleimide compounds (B), the above-described bismaleimide compounds are preferred from the viewpoint of, for example, the curability and viscosity of the curable composition and the heat resistance and dielectric properties of the cured product. In particular, a maleimide compound in which X in structural formula (8) is any of structural formulae (X-1) to (X-4) is preferred, and a maleimide compound in which X is (X-3) or (X-4) is more preferred.

In the curable composition according to the present invention, the mixing proportions of the aromatic ester resin (A) and the maleimide compound (B) are not particularly limited and are appropriately adjusted in accordance with, for example, desired performance of a cured product. Specifically, the maleimide compound (B) is preferably used in an amount of 10 to 300 parts by mass, more preferably 20 to 200 parts by mass based on 100 parts by mass of the aromatic ester resin (A) because the curable composition provides a cured product having an excellent balance between the heat resistance and the dielectric properties.

The curable composition according to the present invention may contain other components in addition to the aromatic ester resin (A) and the maleimide compound (B). Examples of other components will be described below. Other components that can be contained in the curable composition according to the present invention are not limited to those exemplified below. Components other than those may be contained.

[Other Resin Components]

Specific examples of other resin components include, but are not particularly limited to, polyester resins other than the aromatic ester compound (A), imide resins other than the maleimide compound (B), epoxy resins, phenolic resins, amine compounds, imidazole compounds, acid anhydride, cyanate ester resins, benzoxazine resins, triazine-containing cresol novolac resins, cyanic ester resins, styrene-maleic anhydride resins, ally group-containing resins, such as diallyl bisphenol and triallyl isocyanurate, polyphosphate esters, phosphoric ester-carbonate copolymers, polyphenylene ether resins, and polybutadiene resins. These other resins may be used alone or in combination of two or more.

[Solvent]

In an embodiment, the composition may contain a solvent. The solvent has, for example, the function of adjusting the viscosity of the composition.

Specific examples of the solvent include, but are not particularly limited to, ketones, such as acetone, methyl ethyl ketone, and cyclohexanone; esters, such as ethyl acetate, butyl acetate, cellosolve acetate, propylene glycol monomethyl ether acetate, and carbitol acetate; carbitols, such as cellosolve and butyl carbitol; aromatic hydrocarbons, such as toluene and xylene; and amides, such as dimethylformamide, dimethylacetamide, and N-methylpyrrolidone. These solvents may be used alone or in combination of two or more.

The amount of the solvent used is preferably 10% to 80% by mass, more preferably 20% to 70% by mass based on the total mass of the curable composition. When the amount of the solvent used is 10% or more by mass, good handleability is provided, which is preferred. When the amount of the solvent used is 80% or less by mass, good impregnation properties with another base material are provided, which is preferred.

[Additive]

In an embodiment, the composition may contain an additive. Examples of the additive include curing accelerators, flame retardants, and fillers.

(Curing Accelerator)

Examples of the curing accelerators include, but are not particularly limited to, phosphorus-based curing accelerators, amine-based curing accelerators, imidazole-based curing accelerators, guanidine-based curing accelerators, urea-based curing accelerators, peroxides, and azo compounds.

Examples of the phosphorus-based curing accelerators include, organic phosphine compounds, such as triphenylphosphine, tributylphosphine, tri(p-tolyl)phosphine, diphenylcyclohexylphosphine, and tricyclohexylphosphine; organic phosphite compounds, such as trimethyl phosphite and triethyl phosphite; and phosphonium salts, such as ethyltriphenylphosphonium bromide, benzyltriphenylphosphonium chloride, butylphosphonium tetraphenylborate, tetraphenylphosphonium tetraphenylborate, tetraphenylphosphonium tetra-p-tolylborate, triphenylphosphine-triphenylborane, tetraphenylphosphonium thiocyanate, tetraphenylphosphonium dicyanamide, butylphenylphosphonium dicyanamide, and tetrabutylphosphonium decanoate.

Examples of the amine-based curing accelerators include triethylamine, tributylamine, N,N-dimethyl-4-aminopyridine (DMAP), 2,4,6-tris(dimethylaminomethyl)phenol, 1,8-diazabicyclo[5,4,0]-undecene-7 (DBU), and 1,5-diazabicyclo[4,3,0]-nonene-5 (DBN).

Examples of the imidazole-based curing accelerators include 2-methylimidazole, 2-undecylimidazole, 2-heptadecylimidazole, 1,2-dimethylimidazole, 2-ethyl-4-methylimidazole, 2-phenylimidazole, 2-phenyl-4-methylimidazole, 1-benzyl-2-methylimidazole, 1-benzyl-2-phenylimidazole, 1-cyanoethyl-2-methylimidazole, 1-cyanoethyl-2-undecylimidazole, 1-cyanoethyl-2-ethyl-4-methylimidazole, 1-cyanoethyl-2-phenylimidazole, 1-cyanoethyl-2-undecylimidazolium trimellitate, 1-cyanoethyl-2-phenylimidazolium trimellitate, an isocyanuric acid adduct of 2-phenylimidazole, 2-phenyl-4,5-dihydroxymethylimidazole, 2-phenyl-4-methyl-5hydroxymethylimidazole, 2,3-dihydro-1H-pyrrolo[1,2-a]benzimidazole, 1-dodecyl-2-methyl-3-benzylimidazolium chloride, and 2-methylimidazoline.

Examples of the guanidine-based curing accelerators include dicyandiamide, 1-methylguanidine, 1-ethylguanidine, 1-cyclohexylguanidine, 1-phenylguanidine, dimethylguanidine, diphenylguanidine, trimethylguanidine, tetramethylguanidine, pentamethylguanidine, 1,5,7-triazabicyclo[4.4.0]dec-5-ene, 7-methyl-1,5,7-triazabicyclo[4.4.0]dec-5-ene, 1-methylbiguanide, 1-ethylbiguanide, 1-butylbiguanide, 1-cyclohexylbiguanide, 1-allybiguanide, and 1-phenylbiguanide.

Examples of the urea-based curing accelerators include 3-phenyl-1,1-dimethylurea, 3-(4-methylphenyl)-1,1-dimethylurea, chlorophenylurea, 3-(4-chlorophenyl)-1,1-dimethylurea, and 3-(3,4-dichlorophenyl)-1,1-dimethylurea.

Examples of the peroxides and the azo compounds include benzoyl peroxide, p-chlorobenzoyl peroxide, di-tert-butyl peroxide, diisopropyl peroxycarbonate, di-2-ethylhexyl peroxycarbonate, and azobisisobutyronitrile.

Among these curing accelerators, 2-ethyl-4-methylimidazole or dimethylaminopyridine is preferably used.

These curing accelerators described above may be used alone or in combination of two or more.

The amount of the curing accelerator used is preferably 0.01 to 5 parts by mass, more preferably 0.1 to 3 based on 100 parts by mass of the resin solid content of the curable composition. When the amount of the curing accelerator used is 0.01 parts or more by mass, good curability is obtained, which is preferred. When the amount of the curing accelerator used is 5 parts or less by mass, good formability is obtained, which is preferred.

(Flame Retardant)

Examples of the flame retardants include, but are not particularly limited to, inorganic phosphorus-based flame retardants, organic phosphorus-based flame retardants, and halogen-containing flame retardants.

Examples of the inorganic phosphorus-based flame retardants include, but are not particularly limited to, red phosphorus; ammonium phosphates, such as ammonium phosphate monobasic, ammonium phosphate dibasic, ammonium phosphate tribasic, and ammonium polyphosphate; and phosphoramide.

Examples of the organic phosphorus-based flame retardants include, but are not particularly limited to, phosphoric esters, such as methyl acid phosphate, ethyl acid phosphate, isopropyl acid phosphate, dibutyl phosphate, monobutyl phosphate, butoxyethyl acid phosphate, 2-ethylhexyl acid phosphate, bis(2-ethylhexyl)phosphate, monoisodecyl acid phosphate, lauryl acid phosphate, tridecyl acid phosphate, stearyl acid phosphate, isostearyl acid phosphate, oleyl acid phosphate, butyl pyrophosphate, tetracosyl acid phosphate, ethylene glycol acid phosphate, and (2-hydroxyethyl) methacrylate acid phosphate; diphenylphosphines, such as 9,10-dihydro-9-oxa-10-phosphaphenanthrene-10-oxide and diphenylphosphine oxide; phosphorus-containing phenols, such as 10-(2,5-dihydroxyphenyl)-10H-9-oxa-10-phosphaphenanthrene-10-oxide, 10-(1,4-dioxynaphthalene)-10H-9-oxa-10-phosphaphenanthrene-10-oxide, diphenylphosphinyl hydroquinone, diphenylphosphenyl-1,4-dioxynaphthalene, 1,4-cyclooctylenephosphinyl-1,4-phenyldiol, and 1,5-cyclooctylenephosphinyl-1, 4-phenyldiol; cyclic phosphorus compounds, such as 9,10-dihydro-9-oxa-10-phosphaphenanthrene-10-oxide, 10-(2,5-dihydrooxyphenyl)-10H-9-oxa-10-phosphaphenanthrene-10-oxide, and 10-(2,7-dihydrooxynaphthyl)-10H-9-oxa-10-phosphaphenanthrene-10-oxide; and compounds obtained by reacting the phosphoric esters, the diphenylphosphines, or the phosphorus-containing phenols with epoxy resins, aldehyde compounds, or phenol compounds.

Examples of the halogen-containing flame retardants include, but are not particularly limited to, brominated polystyrene, bis(pentabromophenyl)ethane, tetrabromobisphenol A bis(dibromopropyl ether), 1,2-bis(tetrabromophthalimide), 2,4,6-tris(2,4,6-tribromophenoxy)-1,3,5-triazine, and tetrabromophthalic acid.

These flame retardants described above may be used alone or in combination of two or more.

The amount of the flame retardant used is preferably 0.1 to 50 parts by mass, more preferably 1 to 30 based on 100 parts by mass of the resin solid content of the curable composition. When the amount of the flame retardant used is 0.1 parts or more by mass, flame retardancy can be imparted, which is preferred. When the amount of the flame retardant used is 50 parts or less by mass, flame retardancy can be imparted while maintaining the dielectric properties, which is preferred.

(Filler)

Examples of the fillers include organic fillers and inorganic fillers. The fillers have, for example, the functions of improving elongation and mechanical strength.

Examples of the organic fillers include, but are not particularly limited to, polyamide particles.

Examples of the inorganic fillers include, but are not particularly limited to, silica, alumina, glass, cordierite, silicon oxide, barium sulfate, barium carbonate, aluminum hydroxide, magnesium hydroxide, calcium carbonate, magnesium carbonate, magnesium oxide, boron nitride, aluminum nitride, manganese nitride, aluminum borate, strontium carbonate, strontium titanate, calcium titanate, magnesium titanate, bismuth titanate, titanium oxide, zirconium oxide, barium titanate, barium zirconate titanate, barium zirconate, calcium zirconate, zirconium phosphate, zirconium phosphate tungstate, talc, clay, mica powder, zinc oxide, hydrotalcite, boehmite, and carbon black.

Among these, silica is preferably used. In this case, Examples of silica that can be used include amorphous silica, fused silica, crystalline silica, synthetic silica, and hollow silica.

The fillers described above may be surface-treated as needed. Examples of a surface treatment agent that can be used in this case include, but are not particularly limited to, aminosilane-based coupling agents, epoxysilane-based coupling agents, mercaptosilane-based coupling agents, silane-based coupling agents, organosilazane compounds, and titanate-based coupling agents. Specific examples of the surface treatment agents include 3-glycidoxypropyltrimethoxysilane, 3-mercaptopropyltrimethoxysilane, 3-aminopropyltriethoxysilane, N-phenyl-3-aminopropyltrimethoxysilane, and hexamethyldisilazane.

These fillers described above may be used alone or in combination of two or more.

The average particle size of each of the fillers is preferably, but is not particularly limited to, 0.01 to 10 µm, more preferably 0.03 to 5 µm, even more preferably 0.05 to 3 µm. In the present specification, the "particle size" refers to the maximum distance between two points on the outline of a particle. The "average particle size" refers to a value obtained by a method including measuring the particle sizes of freely-selected 100 particles on one screen in an image with a scanning electron microscope (SEM) and calculating the average value thereof.

The amount of the filler used is preferably 0.5 to 95 parts by mass, more preferably 5 to 80 parts by mass based on 100 parts by mass of the resin solid content of the curable composition. When the amount of the filler used is 0.5 parts or more by mass, low thermal expansion can be provided, which is preferred. When the amount of the filler used is 95 parts or less by mass, a good balance between characteristics and formability is provided, which is preferred.

<Cured Product (Cured Product of Curable Composition)>

According to an embodiment of the present invention, a cured product obtained by curing the curable composition containing the aromatic ester compound (A) and the maleimide compound (B) is provided.

The aromatic ester compound (A) described above has a polymerizable unsaturated bond-containing substituent and thus can be polymerized by itself to provide a cured product.

The cured product may contain the curing agent, the additive, the curing accelerator, and so forth as needed.

The aromatic ester compound (A) itself has a low dielectric loss tangent; hence, the resulting cured product thereof has a low dielectric loss tangent and higher heat resistance. Thus, the cured product can be used for electronic material applications, such as semiconductor package substrates, printed wiring boards, build-up adhesive films, and semiconductor sealing materials. Additionally, it can also be used for applications, such as adhesives and paints.

The heating temperature for heat curing is preferably, but not particularly limited to, 150° C. to 300° C., more preferably 175° C. to 250° C.

EXAMPLES

While the present invention will be described below with reference to examples, the present invention is not limited to the description of these examples.

Production Example 1: Production of Aromatic Ester Compound (A-1)

Into a flask equipped with a thermometer, a dropping funnel, a condenser, a fractionating column, and a stirrer, 165 g of a resin (hydroxyl equivalent: 165 g/eq., softening point: 85° C.) obtained by the polyaddition reaction of dicyclopentadiene and phenol, 134 g of o-allylphenol, and 1,200 g of toluene were charged. The contents were dissolved while the system was reduced in pressure and filled with nitrogen. Next, 203 g of isophthaloyl chloride was added thereto and dissolved while the system was reduced in pressure and filled with nitrogen. Then 0.6 g of tetrabutylammonium bromide was added thereto and dissolved. The system was controlled to 60° C. or lower while nitrogen gas purging was performed, and 412 g of a 20% aqueous solution of sodium hydroxide was added dropwise thereto over a period of 3 hours. After the dropwise addition, stirring was continued for 1 hour under the same temperature. The reaction mixture was allowed to stand and separated into two phases. The aqueous layer was removed. Water was added to the resulting organic layer. The mixture was stirred for about 15 minutes, allowed to stand, and separated into two phases. The aqueous layer was removed. This washing operation with water was repeated until the pH of the aqueous layer reached 7. The organic layer after the washing with water was evaporated by heating under reduced pressure to give 385 g of an aromatic ester compound (A-1). The theoretical structure of the aromatic ester compound (A-1) is illustrated below. The aromatic ester compound (A-1) had an ester equivalent of 214 g/eq., an allyl equivalent of 428 g/eq., and a softening point of 82° C.

[Chem. 16]

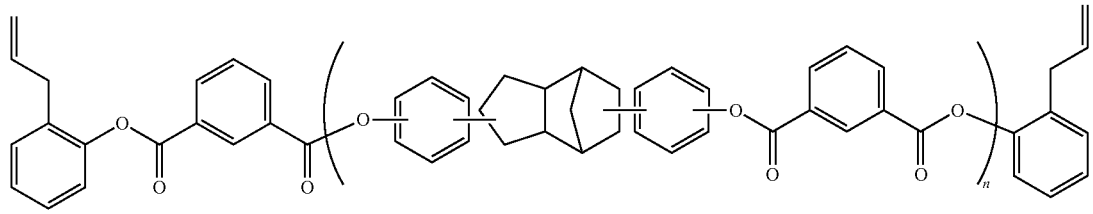

Production Example 2: Production of Aromatic Ester Compound (A-2)

Next, 402 g of an aromatic ester compound (A-2) was prepared as in Production Example 1, except that 160 g of diallyl bisphenol A was used in place of 165 g of the resin obtained by the polyaddition reaction of dicyclopentadiene and phenol in Production Example 1. The theoretical structure of the aromatic ester compound (A-2) is illustrated below. The aromatic ester compound (A-2) had an ester equivalent of 212 g/eq., an allyl equivalent of 212 g/eq., and a softening point of 51° C.

[Chem. 17]

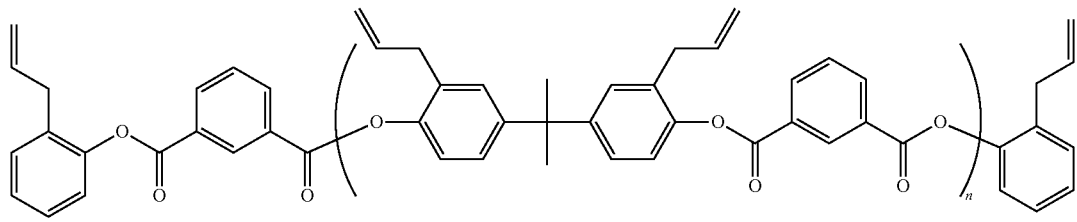

Comparative Synthesis Example 1

Into a flask equipped with a thermometer, a dropping funnel, a condenser, a fractionating column, and a stirrer, 165 g of a resin (hydroxyl equivalent: 165 g/eq., softening point: 85° C.) obtained by the polyaddition reaction of dicyclopentadiene and phenol, 72 g (0.5 mol) of a-naphthol, and 630 g of toluene were charged. The system was reduced in pressure and filled with nitrogen. The mixture was dissolved. Next, 152 g (0.75 mol) of isophthaloyl chloride was added thereto. The system was reduced in pressure and filled with nitrogen. The isophthaloyl chloride was dissolved. Then 0.6 g of tetrabutylammonium bromide was dissolved therein. The system was controlled to 60° C. or lower while nitrogen gas purging was performed, and 315 g of a 20% aqueous solution of sodium hydroxide was added dropwise thereto over a period of 3 hours. Subsequently, stirring was continued for 1.0 hour under the conditions. After the completion of the reaction, the mixture was allowed to stand and separated into two phases. The aqueous layer was removed. Water was added to the toluene layer containing the reactants dissolved. The mixture was stirred for about 15 minutes, allowed to stand, and separated into two phases. The aqueous layer was removed. This operation was repeated until the pH of the aqueous layer reached 7. Drying was then performed by heating under reduced pressure to prepare an active ester resin (A'). The active ester resin (A') had an ester equivalent of 223 g/eq. and a softening point of 150° C.

Examples 1 and 2 and Comparative Example 1

Components were mixed in proportions given in Tables 1 to 3 to prepare curable compositions. With respect to the resulting curable compositions, the evaluation of the heat resistance and the measurement the dielectric loss tangent of each of the resulting cured products were performed. Tables 1 to 3 present the results.

Details of the components are described below.
Maleimide resin (B): 4,4'-diphenylmethane bismaleimide ("BMI-1000", available from Daiwakasei Industry Co., Ltd., maleimide equivalent: 179 g/eq.)
Epoxy resin (1): dicyclopentadiene phenol-type epoxy resin ("HP-7200H", available from DIC Corporation, epoxy equivalent: 277 g/eq.)
Epoxy resin (2): bisphenol A-type epoxy resin ("EPICLON 850S", available from DIC Corporation, epoxy equivalent: 188 g/eq.)
DABPA: diallylbisphenol A (available from Daiwakasei Industry Co., Ltd., allyl equivalent: 154 g/eq.)
DMAP: dimethylaminopyridine
Production of Cured Product
Each of the curable compositions was poured into a mold measuring 11 cm×9 cm×2.4 mm and molded with a pressing machine at 150° C. for 60 minutes, then at 175° C. for 90 minutes, and then at 200° C. for 90 minutes. The molded article was removed from the mold and further cured at 230° C. for 4 hours to provide a cured product.
Evaluation of Heat Resistance (Measurement of Glass Transition Temperature)
A test piece having a width of 5 mm and a length of 54 mm was cut out from the 2.4-mm-thick cured product obtained above. The test piece was subjected to dynamic mechanical analysis (DMA) using a rectangular tension method with an RSA II solid viscoelasticity measuring instrument, available from Rheometric Scientific, to measure the temperature at which the maximum change in elastic modulus (the maximum rate of change of tan δ) was obtained as a glass transition temperature. The measurement conditions were as follows: a frequency of 1 Hz and a rate of temperature increase of 3° C./min.

Measurement of Dielectric Loss Tangent

The cured product obtained above was vacuum-dried by heating at 105° C. for 2 hours and then stored in a room at a temperature of 23° C. and a humidity of 50% for 24 hours to provide a test piece. The dielectric loss tangent of the test piece was measured at 1 GHz by a resonant cavity method with an "E8362C network analyzer", available from Agilent Technologies, Inc.

TABLE 1

|  |  | Example 1 | Example 2 | Comparative example 1 | Comparative example 2 | Comparative example 3 |
|---|---|---|---|---|---|---|
| Aromatic ester resin (A-1) | [parts by mass] | 70.5 | | | | |
| Aromatic ester resin (A-2) | [parts by mass] | | 54.2 | | | |
| Aromatic ester resin (A') | [parts by mass] | | | 44.6 | 54.3 | |
| Bismaleimide (B) | [parts by mass] | 29.5 | 45.8 | | | 53.8 |
| Epoxy resin (1) | [parts by mass] | | | 55.4 | | |
| Epoxy resin (2) | [parts by mass] | | | | 45.7 | |
| DABPA | [parts by mass] | | | | | 46.3 |
| DMAP | [parts by mass] | | | 0.5 | 0.5 | |
| Dicumyl peroxide | [parts by mass] | 1.0 | 1.0 | | | 1.0 |
| Heat resistance |  | 219 | >350 | 180 | 157 | >350 |
| Dielectric loss tangent |  | 0.0035 | 0.0075 | 0.0070 | 0.0080 | 0.0170 |

The invention claimed is:

1. A curable composition, comprising:
an aromatic ester resin (A) and a maleimide compound (B), the aromatic ester resin (A) being an active ester resin that is a reaction product of:
a first aromatic compound having two or more phenolic hydroxy groups;
a second aromatic compound having a phenolic hydroxy group; and
a third aromatic compound having two or more carboxy groups and/or an acid halide thereof or an esterified compound thereof,
wherein at least one of the first aromatic compound, the second aromatic compound, and the third aromatic compound and/or the acid halide thereof or the esterified compound thereof has a polymerizable unsaturated bond-containing substituent.

2. The curable composition according to claim 1, wherein the first aromatic compound is represented by chemical formula (1):

[Chem. 1]

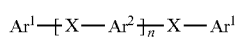
(1)

where in chemical formula (1), each $Ar^1$ is independently a substituted or unsubstituted first aromatic ring group having 3 to 30 carbon atoms, each $Ar^2$ is independently a substituted or unsubstituted second aromatic ring group having 3 to 30 carbon atoms, each X is independently an oxygen atom, a sulfur atom, a substituted or unsubstituted alkylene having 1 to 20 carbon atoms, a substituted or unsubstituted cycloalkylene having 3 to 20 carbon atoms, or an aralkylene having 8 to 20 carbon atoms, and n is 0 to 10, wherein at least two hydrogen atoms of $Ar^1$ and $Ar^2$ are replaced with hydroxy groups.

3. The curable composition according to claim 2, wherein each X is a substituted or unsubstituted cycloalkylene having 1 to 20 carbon atoms or an aralkylene having 8 to 20 carbon atoms.

4. The curable composition according to claim 1, wherein the second aromatic compound is a fused ring aromatic compound.

5. The curable composition according to claim 1, wherein the maleimide compound (B) is a compound having two or more maleimide groups in a molecule.

6. A cured product of the curable composition according to claim 1.

7. A printed wiring board obtained using the curable composition according to claim 1.

8. A semiconductor sealing material obtained using the curable composition according to claim 1.

9. A build-up film obtained using the curable composition according to claim 1.

10. The curable composition according to claim 1, wherein the first aromatic compound is represented by chemical formula (1):

[Chem. 1]

(1)

where in chemical formula (1),
each $Ar^1$ is independently a substituted or unsubstituted first aromatic ring group having 3 to 30 carbon atoms,
each $Ar^2$ is independently a substituted or unsubstituted second aromatic ring group having 3 to 30 carbon atoms,
each X is independently an oxygen atom, a sulfur atom, a substituted or unsubstituted alkylene having 1 to 20 carbon atoms, a substituted or unsubstituted cycloalkylene having 3 to 20 carbon atoms, or an aralkylene having 8 to 20 carbon atoms, and
n is 0 to 10,
wherein at least two hydrogen atoms of $Ar^1$ and $Ar^2$ are replaced with hydroxy groups, and
wherein the second aromatic compound is a fused ring aromatic compound.

11. The curable composition according to claim 2, wherein each X is a substituted or unsubstituted cycloalkylene having 1 to 20 carbon atoms or an aralkylene having 8 to 20 carbon atoms, and
wherein the second aromatic compound is a fused ring aromatic compound.

12. The curable composition according to claim 1, wherein the first aromatic compound is represented by chemical formula (1):

[Chem. 1]

(1)

where in chemical formula (1),
each $Ar^1$ is independently a substituted or unsubstituted first aromatic ring group having 3 to 30 carbon atoms,
each $Ar^2$ is independently a substituted or unsubstituted second aromatic ring group having 3 to 30 carbon atoms,
each X is independently an oxygen atom, a sulfur atom, a substituted or unsubstituted alkylene having 1 to 20 carbon atoms, a substituted or unsubstituted cycloalkylene having 3 to 20 carbon atoms, or an aralkylene having 8 to 20 carbon atoms, and
n is 0 to 10,
wherein at least two hydrogen atoms of $Ar^1$ and $Ar^2$ are replaced with hydroxy groups, and wherein the maleimide compound (B) is a compound having two or more maleimide groups in a molecule.

13. The curable composition according to claim 2, wherein each X is a substituted or unsubstituted cycloalkylene having 1 to 20 carbon atoms or an aralkylene having 8 to 20 carbon atoms, and
wherein the maleimide compound (B) is a compound having two or more maleimide groups in a molecule.

14. The curable composition according to claim 1, wherein the second aromatic compound is a fused ring aromatic compound, and
wherein the maleimide compound (B) is a compound having two or more maleimide groups in a molecule.

15. The cured product of the curable composition according to claim 6, wherein the first aromatic compound is represented by chemical formula (1):

[Chem. 1]

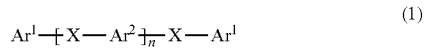
(1)

where in chemical formula (1),
each $Ar^1$ is independently a substituted or unsubstituted first aromatic ring group having 3 to 30 carbon atoms,
each $Ar^2$ is independently a substituted or unsubstituted second aromatic ring group having 3 to 30 carbon atoms,
each X is independently an oxygen atom, a sulfur atom, a substituted or unsubstituted alkylene having 1 to 20 carbon atoms, a substituted or unsubstituted cycloalkylene having 3 to 20 carbon atoms, or an aralkylene having 8 to 20 carbon atoms, and
n is 0 to 10,
wherein at least two hydrogen atoms of $Ar^1$ and $Ar^2$ are replaced with hydroxy groups.

16. The cured product of the curable composition according to claim 15,
wherein each X is a substituted or unsubstituted cycloalkylene having 1 to 20 carbon atoms or an aralkylene having 8 to 20 carbon atoms.

17. The cured product of the curable composition according to claim 6,
wherein the second aromatic compound is a fused ring aromatic compound.

18. The cured product of the curable composition according to claim 6,
wherein the maleimide compound (B) is a compound having two or more maleimide groups in a molecule.

* * * * *